(12) United States Patent
Gostein et al.

(10) Patent No.: US 8,440,979 B2
(45) Date of Patent: May 14, 2013

(54) ULTRAVIOLET LIGHT EXPOSURE CHAMBER FOR PHOTOVOLTAIC MODULES

(75) Inventors: Michael Gostein, Austin, TX (US); William Stueve, Austin, TX (US)

(73) Assignee: Atonometrics, Inc., Austin, TX (US)

( * ) Notice: Subject to any disclaimer, the term of this patent is extended or adjusted under 35 U.S.C. 154(b) by 0 days.

(21) Appl. No.: 13/124,146

(22) PCT Filed: Oct. 16, 2009

(86) PCT No.: PCT/US2009/060967
§ 371 (c)(1),
(2), (4) Date: Apr. 18, 2011

(87) PCT Pub. No.: WO2010/045534
PCT Pub. Date: Apr. 22, 2010

(65) Prior Publication Data
US 2011/0198509 A1  Aug. 18, 2011

Related U.S. Application Data

(60) Provisional application No. 61/106,311, filed on Oct. 17, 2008.

(51) Int. Cl.
*G01J 1/42* (2006.01)

(52) U.S. Cl.
USPC .................................................. 250/372

(58) Field of Classification Search ............ 250/372
See application file for complete search history.

(56) References Cited

U.S. PATENT DOCUMENTS

| 5,054,480 A | * | 10/1991 | Bare et al. ............ 128/201.25 |
| 5,372,781 A | * | 12/1994 | Hallett et al. ........... 422/186.3 |
| 5,568,366 A | * | 10/1996 | Jefferies ..................... 362/1 |
| 6,033,459 A | * | 3/2000 | Hase ........................... 95/82 |
| 6,467,911 B1 | * | 10/2002 | Ueyama et al. ............. 353/87 |
| 2006/0072314 A1 | * | 4/2006 | Rains ..................... 362/231 |
| 2007/0086009 A1 | * | 4/2007 | Ehbets et al. .............. 356/402 |
| 2007/0228618 A1 | * | 10/2007 | Kaszuba et al. ............ 264/494 |
| 2007/0287091 A1 | * | 12/2007 | Jacobo et al. .............. 430/154 |
| 2009/0080215 A1 | * | 3/2009 | Anandan .................. 362/606 |

FOREIGN PATENT DOCUMENTS

JP  2005253799 A  * 9/2005

* cited by examiner

*Primary Examiner* — Kiho Kim
(74) *Attorney, Agent, or Firm* — Hulsey, P.C.; Loren T. Smith; William N. Hulsey, III

(57) ABSTRACT

An apparatus for performing UV light exposure testing of solar panels, also known as PV modules, with superior exposure uniformity, equipment throughput, and floor space requirements, consisting of a chamber including a plurality of UV lamps in a lamp array, at least one target plane, and reflective panels positioned within the chamber to redirect UV light to the target plane(s).

3 Claims, 9 Drawing Sheets

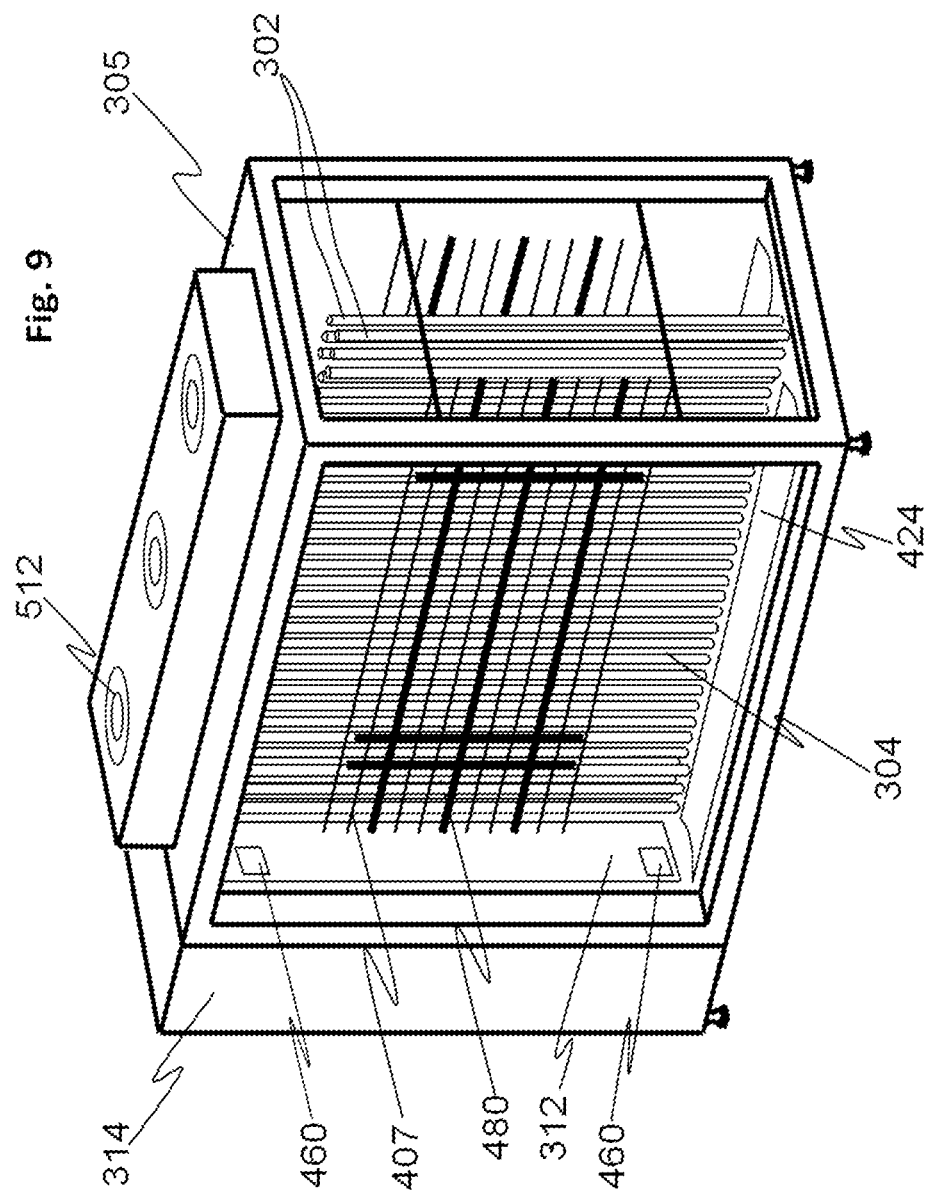

ULTRAVIOLET LIGHT EXPOSURE CHAMBER FOR PHOTOVOLTAIC MODULES

RELATED APPLICATION DATA

The present U.S. Utility Patent Application claims priority pursuant to 35 U.S.C. §371, as a national application, to the following International Application which is hereby incorporated herein by reference in its entirety and made part of the present U.S. Utility Patent Application for all purposes:

1. International Application Serial No. PCT/US2009/060967, entitled "ULTRAVIOLET LIGHT EXPOSURE CHAMBER FOR PHOTOVOLTAIC MODULES," filed Oct. 16, 2009, which claims priority pursuant to 35 U.S.C. §119(e) to the following U.S. Provisional Patent Application which is hereby incorporated herein by reference in its entirety and made part of the present U.S. Utility Patent Application for all purposes:

a. U.S. Provisional Application Ser. No. 61/106,311, entitled "ULTRAVIOLET LIGHT EXPOSURE CHAMBER FOR PHOTOVOLTAIC MODULES," filed Oct. 17, 2008, which is incorporated herein by reference.

FIELD OF THE INVENTION

The invention relates generally photovoltaic (PV) modules and more specifically to light exposure testing of solar panels.

BACKGROUND OF THE INVENTION

Manufacturers of solar panels, also known as photovoltaic (PV) modules, regularly subject their products to reliability tests intended to provide accelerated testing of degradation and failure modes. One important factor in various degradation and failure modes is exposure to ultraviolet (UV) radiation in sunlight, specifically in the UVA (320-400 nm) and UVB (280-320 nm) wavelength ranges.

PV manufacturers therefore include UV light exposure testing as part of their product reliability analysis. Indeed, UV exposure testing is required for PV module certification to industry standards such as International Electrotechnical Commission (IEC) 61215 and 61646, which are widely adopted. These standards call for exposure of PV modules to at least 15 kW-hr/m$^2$ of UVA and UVB radiation for approval of new product designs. It is widely acknowledged that actual UV exposures greatly exceed this level after only a few months of operation in the field. Therefore more extensive UV exposure testing is desirable.

However, existing UV exposure test equipment is not optimized for high-volume manufacturing requirements and is inadequate to meet the growing PV industry's testing needs. One issue is exposure uniformity. If uniformity is poor, either test quality is compromised or the exposure area must be over-sized compared to the test samples, resulting in higher cost per sample tested. Another issue is floor space. In some systems, modules under test are loaded horizontally onto a test table to be exposed by over-hanging UV lamps. For a large number of exposed modules, this requires significant floor space, since typical PV modules in use today have dimensions up to 1 m×1.6 m.

In view of the shortcomings of existing equipment, there is a need for an improved apparatus for UV exposure testing of PV modules.

BRIEF SUMMARY OF THE INVENTION

The disclosed subject matter provides an apparatus for performing UV light exposure testing of PV modules. It is an object of the disclosed subject matter to provide an apparatus for testing multiple PV modules with superior exposure uniformity, equipment throughput, and floor space requirements.

The apparatus comprises a chamber including a vertically oriented array of UV lamps, at least one vertically oriented target plane for placing PV modules under test, and panels reflective to UV radiation positioned around the sides of the exposure area. The vertical orientation of the lamp array and target planes reduces the floor space requirements of the system. The reflective panels improve exposure uniformity, allowing efficient use of the UV lamps.

In one embodiment, the apparatus includes only one target plane on one side of the lamp array and a back-reflector on the other side of the lamp array to direct light to the one target plane.

In another embodiment, the apparatus includes two target planes, one on either side of the lamp array. The use of two target planes reduces the UV exposure intensity that may be achieved at one test sample as compared with the embodiment involving one target plane only and a back-reflector positioned behind the lamps. However, the reduction in exposure intensity is less than a factor of two—since the efficiency of a back reflector is less than 100%—while the additional target plane allows simultaneous exposure of twice as many samples.

In yet another embodiment, a system designed to use two target planes may be operated with test modules mounted on one target plane only. Reflectors could be included on at least one of the target planes so that when no test modules are present on that plane, light intensity at the other plane is increased and testing is accelerated.

In one embodiment, the reflective panels include flat side reflectors and/or flat top and bottom reflectors. Side reflectors provide for improved horizontal uniformity of UV irradiance at the target plane(s), while top and bottom reflectors provide for improved vertical uniformity of UV irradiance at the target plane(s).

In an alternative embodiment, the system includes curved reflectors (or collections of flat reflectors approximating curved reflectors) at the top and bottom of the chamber to provide for improved vertical uniformity of UV irradiance at the target plane(s) compared to flat top and bottom reflectors by increasing the irradiance intensity near the top and bottom of the target plane(s) and decreasing the irradiance intensity near the center of the target plane(s).

In one embodiment, lamps near each side reflector are positioned closer to the target plane(s) than lamps in the interior portion of the lamp array, providing improved horizontal uniformity of the UV irradiance at the target plane(s) by compensating for reflective losses at the side reflectors.

The distance between the lamp array and the target plane(s) is chosen to further optimize uniformity, taking into account potential non-uniformities in the lamp intensities. The distance is chosen to be between 4 and 12 times the spacing between lamps in the lamp array; however other spacings are possible.

In one embodiment, the system includes opaque light shields of various size and shape positioned between the lamp array and the target plane(s), to provide for improved irradiance uniformity at the target plane(s) by partially blocking the light from portions of the lamp array responsible for localized irradiance peaks at the target plane(s).

Optionally, the system may be operated with a portion of the lamp array unused. Furthermore, additional reflectors may be added to the system to improve intensity and uniformity when a portion of the lamp array is not used.

In one embodiment, the system includes a diffusing material interposed between the lamp array and the target plane(s) to improve irradiance uniformity at the target plane(s).

In another embodiment, the system includes multiple UV lamp types in order to optimize the spectral distribution of the emitted light for a given test purpose or to reduce the cost to achieve a given spectral requirement by combining low-cost lamps with high-cost lamps.

These and other aspects of the disclosed subject matter, as well as additional novel features, will be apparent from the description provided herein. The intent of this summary is not to be a comprehensive description of the claimed subject matter, but rather to provide a short overview of some of the subject matter's functionality. Other systems, methods, features and advantages here provided will become apparent to one with skill in the art upon examination of the following FIGUREs and detailed description. It is intended that all such additional systems, methods, features and advantages that are included within this description, be within the scope of the claims.

BRIEF DESCRIPTIONS OF THE DRAWINGS

The novel features believed characteristic of the invention will be set forth in the claims. The invention itself, however, as well as a preferred mode of use, further objectives, and advantages thereof, will best be understood by reference to the following detailed description of illustrative embodiments when read in conjunction with the accompanying drawings, wherein:

FIG. 9 depicts the layout of an exemplary UV exposure testing apparatus according to the disclosed subject matter.

DETAILED DESCRIPTION OF ILLUSTRATIVE EMBODIMENTS

Although described with particular reference to UV testing of photovoltaic modules, those with skill in the arts will recognize that the disclosed embodiments have relevance to a wide variety of areas in addition to those specific examples described below.

All references, including publications, patent applications, and patents, cited herein are hereby incorporated by reference to the same extent as if each reference were individually and specifically indicated to be incorporated by reference and were set forth in its entirety herein.

Computing System

Figure 1:
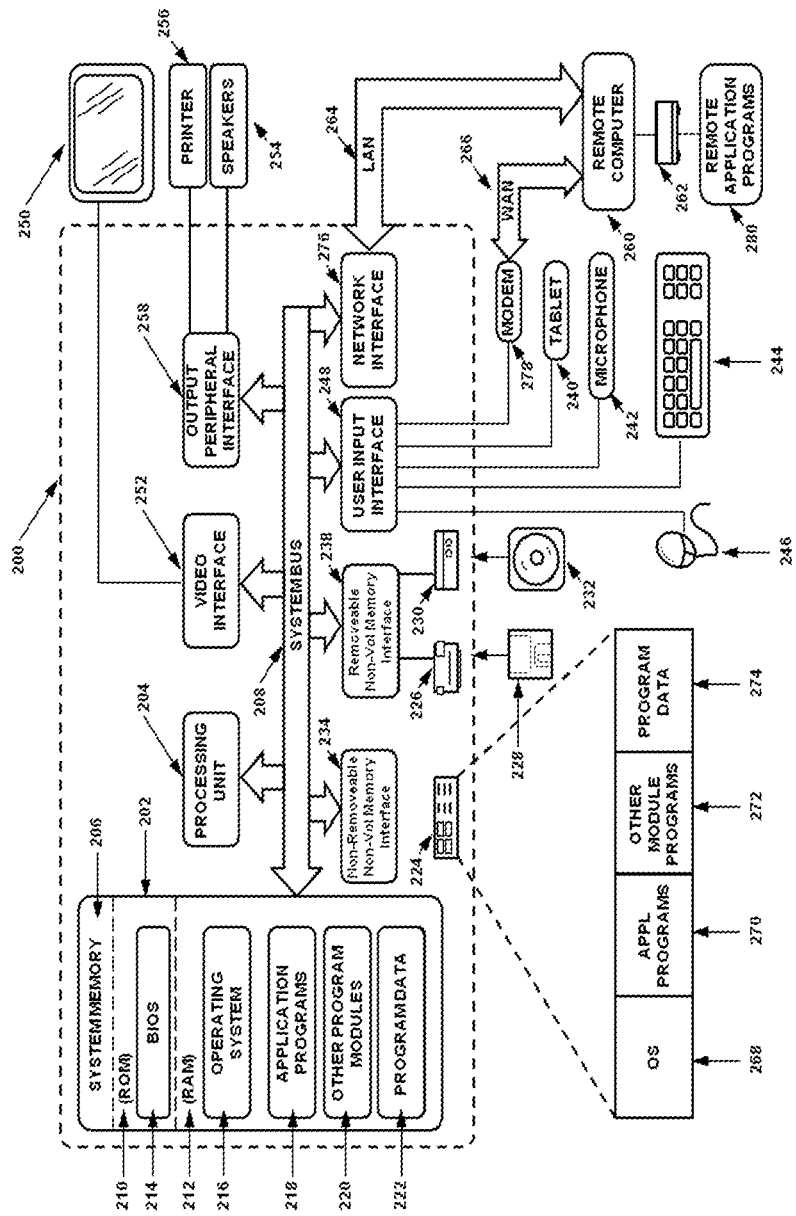
FIG. 1 depicts an exemplary computer system with which the disclosed subject matter could be utilized.

With reference to FIG. 1, an exemplary system within a computing environment for implementing the invention includes a general purpose computing device in the form of a computing system 200, commercially available from Intel, IBM, AMD, Motorola, Cyrix and others. Components of the computing system 202 may include, but are not limited to, a processing unit 204, a system memory 206, and a system bus 236 that couples various system components including the system memory to the processing unit 204. The system bus 236 may be any of several types of bus structures including a memory bus or memory controller, a peripheral bus, and a local bus using any of a variety of bus architectures.

Computing system 200 typically includes a variety of computer readable media. Computer readable media can be any available media that can be accessed by the computing system 200 and includes both volatile and nonvolatile media, and removable and non-removable media. By way of example, and not limitation, computer readable media may comprise computer storage media and communication media. Computer storage media includes volatile and nonvolatile, removable and non-removable media implemented in any method or technology for storage of information such as computer readable instructions, data structures, program modules or other data.

Computer memory includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by the computing system 200.

The system memory 206 includes computer storage media in the form of volatile and/or nonvolatile memory such as read only memory (ROM) 210 and random access memory (RAM) 212. A basic input/output system 214 (BIOS), containing the basic routines that help to transfer information between elements within computing system 200, such as during start-up, is typically stored in ROM 210. RAM 212 typically contains data and/or program modules that are immediately accessible to and/or presently being operated on by processing unit 204. By way of example, and not limitation, an operating system 216, application programs 220, other program modules 220 and program data 222 are shown.

Computing system 200 may also include other removable/non-removable, volatile/nonvolatile computer storage media. By way of example only, a hard disk drive 224 that reads from or writes to non-removable, nonvolatile magnetic media, a magnetic disk drive 226 that reads from or writes to a removable, nonvolatile magnetic disk 228, and an optical disk drive 230 that reads from or writes to a removable, nonvolatile optical disk 232 such as a CD ROM or other optical media could be employed to store some portion of the disclosed subject matter. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The hard disk drive 224 is typically connected to the system bus 236 through a non-removable memory interface such as interface 234, and magnetic disk drive 226 and optical disk drive 230 are typically connected to the system bus 236 by a removable memory interface, such as interface 238.

The drives and their associated computer storage media, discussed above, provide storage of computer readable instructions, data structures, program modules and other data for the computing system 200. For example, hard disk drive 224 is illustrated as storing operating system 268, application programs 270, other program modules 272 and program data 274. Note that these components can either be the same as or different from operating system 216, application programs 220, other program modules 220, and program data 222. Operating system 268, application programs 270, other program modules 272, and program data 274 are given different numbers hereto illustrates that, at a minimum, they are different copies.

A user may enter commands and information into the computing system 200 through input devices such as a tablet, or electronic digitizer, 240, a microphone 242, a keyboard 244, and pointing device 246, commonly referred to as a mouse, trackball, or touch pad. These and other input devices are often connected to the processing unit 204 through a user input interface 248 that is coupled to the system bus 208, but may be connected by other interface and bus structures, such as a parallel port, game port or a universal serial bus (USB).

A monitor 250 or other type of display device is also connected to the system bus 208 via an interface, such as a video interface 252. The monitor 250 may also be integrated with a touch-screen panel or the like. Note that the monitor and/or touch screen panel can be physically coupled to a housing in which the computing system 200 is incorporated, such as in a tablet-type personal computer. In addition, computers such as the computing system 200 may also include other peripheral output devices such as speakers 254 and printer 256, which may be connected through an output peripheral interface 258 or the like.

Computing system 200 may operate in a networked environment using logical connections to one or more remote computers, such as a remote computing system 260. The remote computing system 260 may be a personal computer, a server, a router, a network PC, a peer device or other common network node, and typically includes many or all of the elements described above relative to the computing system 200, although only a memory storage device 262 has been illustrated. The logical connections depicted include a local area network (LAN) 264 connecting through network interface 276 and a wide area network (WAN) 266 connecting via modem 278, but may also include other networks. Such networking environments are commonplace in offices, enterprise-wide computer networks, intranets and the Internet.

The central processor operating pursuant to operating system software such as IBM OS/2®, Linux®, UNIX®, Microsoft Windows®, Apple Mac OSX® and other commercially available operating systems provides functionality for some of the features provided by the present invention. The operating system or systems may reside at a central location or distributed locations (i.e., mirrored or standalone).

Software programs or modules instruct the operating systems to perform tasks such as, but not limited to, facilitating client requests, system maintenance, security, data storage, data backup, data mining, document/report generation and algorithms. The provided functionality may be embodied directly in hardware, in a software module executed by a processor or in any combination of the two.

Furthermore, software operations may be executed, in part or wholly, by one or more servers or a client's system, via hardware, software module or any combination of the two. A software module (program or executable) may reside in RAM memory, flash memory, ROM memory, EPROM memory, EEPROM memory, registers, hard disk, a removable disk, a CD-ROM, DVD, optical disk or any other form of storage medium known in the art. An exemplary storage medium is coupled to the processor such that the processor can read information from, and write information to, the storage medium. In the alternative, the storage medium may be integral to the processor. The processor and the storage medium may also reside in an application specific integrated circuit (ASIC). The bus may be an optical or conventional bus operating pursuant to various protocols that are well known in the art.

Irradiance Uniformity at the Target Plane

Figure 2:
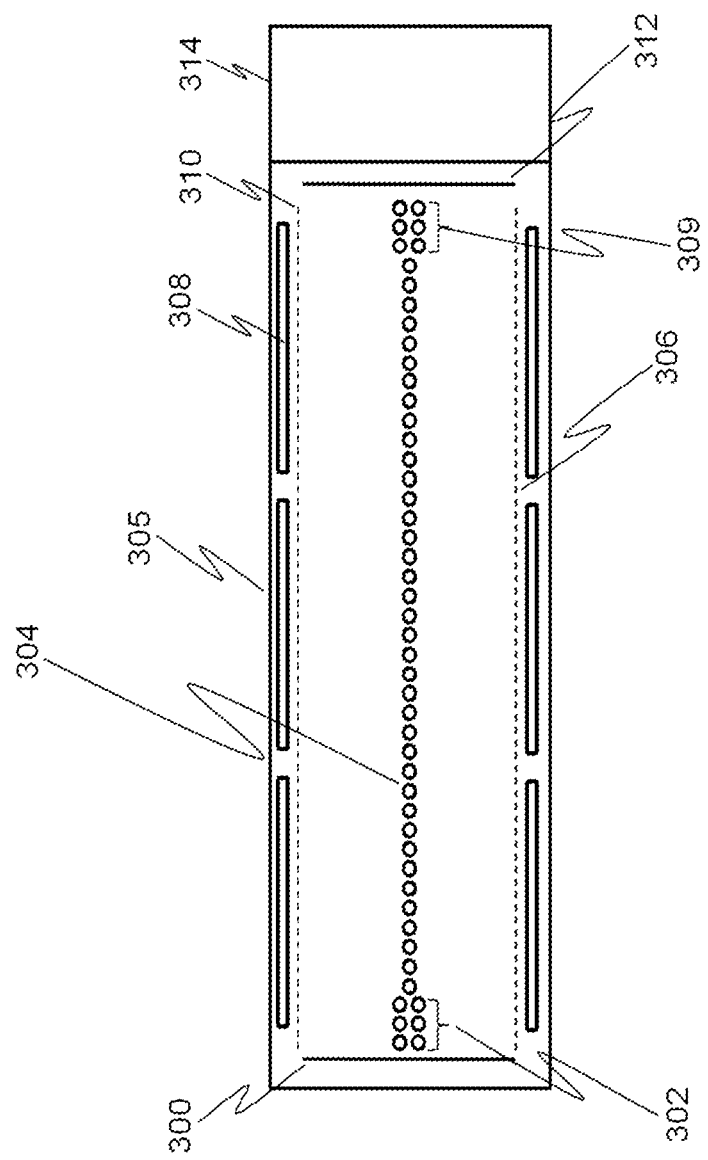
FIG. 2 depicts a cross sectional top view of a UV exposure apparatus with two target planes according to the disclosed subject matter.

Referring generally to FIG. 2, one of the primary challenges addressed with the disclosed UV exposure apparatus is that of achieving a suitable uniformity of irradiance intensity at the target plane(s) 306 and 310. For example, IEC standards 61215 and 61646 for testing of PV modules require UV testing with an irradiance uniformity of +/−15% or better over the area of the PV module(s) under test. It is desirable that test equipment will have even better uniformity, +/−10% or better.

Obtaining desirable exposure uniformity while optimizing cost is difficult for several reasons. One simple approach to obtaining desired uniformity is to over-size the test area, so that uniformity is adequate over a limited area corresponding to the devices to be tested. However, it is desirable to use as few lamps as possible to reduce system footprint, operating cost, and consumables cost. Therefore, alternative solutions are preferred.

Basic Design

In the UV exposure apparatus, the target planes 306 and 310 are oriented vertically. This reduces the floor space requirements as compared with a horizontal target plane orientation; however, a horizontal or other orientation could be used. In addition, in one embodiment, the use of two target planes 306 and 310 on opposite sides of the lamp array 304 reduces the space requirements of the apparatus as compared to an apparatus with a single target plane 330 (not shown) of the same total area.

UV fluorescent tube lamps provide a convenient UV light source. Suitable lamps include nominally 72 inch long 1.5 inch diameter 85/100 W high-output fluorescent tubes. These lamps are available in various types that emit in different wavelength ranges, including broadband UVA types (often designated F72T12-BL-HO) and broadband UVB types (often designated FS72T12-UVB-HO). Suppliers include Solarc Systems, National Biological Corporation, and many others. These lamps typically emit 5 to 25 W of UV radiation per lamp. Although specific lamps are described, other could be used.

Alternative UV light sources include HID lamps, arc, lamps, UV light emitting diodes, etc.

In the UV exposure apparatus, the lamp array 304 is housed in a chamber 305 which includes various reflective surfaces (e.g., side reflectors 300 and 312) which are highly reflective to UV light. An example of a suitable reflector material is Anolux UVS material produced by ALANOD Aluminium-Veredlung GmbH & Co. KG; however other materials could be used. This material has an average reflectance of ~83% in the UV wavelength range from 250 nm to 500 nm. The size, position, and orientation of the reflective surfaces will depend on the reflectance of the reflective material.

Continuing with FIG. 2, which illustrates a top down cross sectional view of a UV exposure system consisting of a chamber 305 including an array of lamps 304 illuminating two target planes 310 and 306 with one or more PV modules 308. The figure is intended to illustrate a design with 50 UV fluorescent tube lamps 304, each of which extends in a direction perpendicular to the cross-section plane; however, more or less lamps in perpendicular or other arrangements/geometries could be used. Finally, an electronics cabinet 314 is provided for control systems or other items.

In one embodiment, the apparatus includes additional lamps 302 and 309 near the edges of the lamp array 304, as shown in FIG. 2. These serve to increase the light intensity at the edges of the lamp array 304 and therefore compensate for intensity losses at the sides due to lower than ideal reflectance of the side reflectors 300 and 312.

Figure 3:
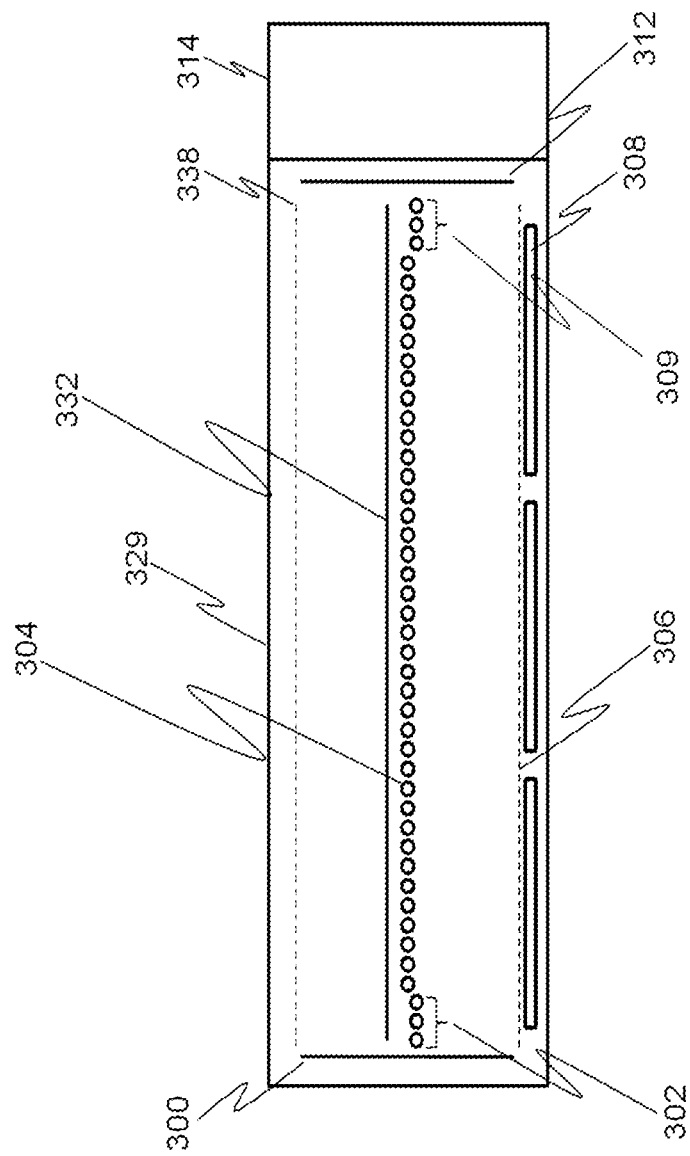
FIG. 3 depicts a cross sectional top down view of a UV exposure apparatus with a single target plane according to the disclosed subject matter.

FIG. 3 illustrates top down cross sectional view of an alternative embodiment of the UV exposure apparatus including a "back reflector" 332 behind the lamp array 304 in order to direct more UV light to a single target plane 306.

The embodiment shown in FIG. 3 may be advantageous if the system operator wishes to expose the PV modules 308 at one target plane 306 to a predetermined dose of UV radiation at an accelerated rate. With an 83% reflectance of the back reflector 332, one would expect this embodiment of the UV exposure apparatus to expose the PV modules 308 to a specified dose of UV radiation in a time, t1, that is about (1/1.83)≈0.546 of the time, t2, required to obtain the same dose of radiation with two target planes 306 and 310, as discussed in reference to FIG. 2. However, absorption of UV radiation by the lamp tubes after reflection from the back reflector 332 may degrade this performance.

Referring generally to both FIGS. 2 and 3, achieving desirable irradiance uniformity at the target plane(s) 306 and 310 with fluorescent tube lamps is complicated by the fact that a fluorescent tube lamp is typically brightest in the center, and dimmest near the electrical connectors at each end of the lamp.

The uniformity of the intensity at the target plane(s) 306 and 310 is a function of the target plane's 306 and 310 distance, D, from the lamp array 304. For a vertical array of fluorescent tube lamps with a diameter of 1.5", a ratio of D to the inter-lamp spacing within the lamp array of between 4 and 12 allows for reasonable magnitudes of intensity to be reached at the target plane(s) 306 and 310, reasonable non-uniformities to be tolerated in lamp irradiance along the vertical lamp axis, and an acceptable footprint size of the system to be achieved. For the system of FIG. 2, exemplary dimensions are an interlamp spacing of 2.0" and lamp array to target plane spacing, D, of ~18.8".

Horizontal Irradiance Uniformity

Figure 4:
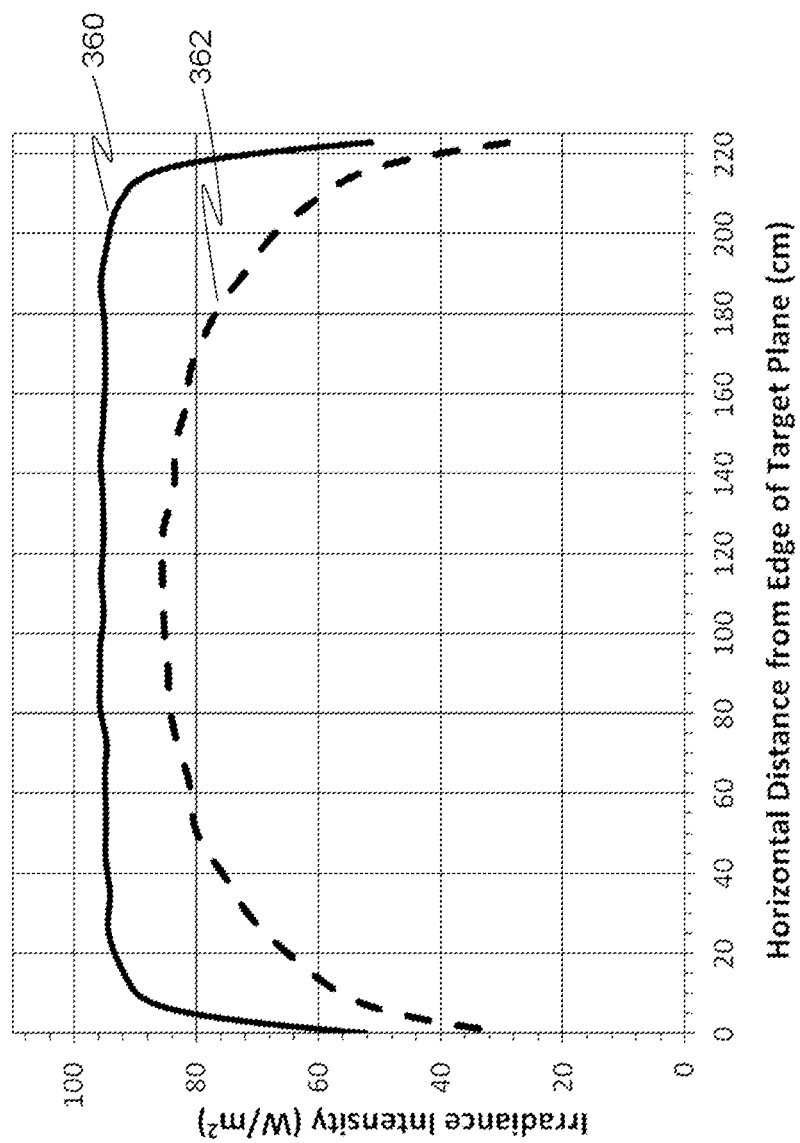
FIG. 4 depicts irradiance intensity profile curves at the target plane(s) of the UV exposure apparatus, contrasting results with and without side reflectors.

FIG. 4 shows an illustration of the benefits of using side reflectors 300 and 312 obtained from ray tracing modeling of the UV exposure apparatus similar to that shown in FIG. 2. Curve 362 is an example of a horizontal intensity profile of the UV chamber 305 depicted in FIG. 2 but without the side reflectors 300 and 312. Curve 360 is an example of a horizontal intensity profile of the UV chamber 305 depicted in FIG. 2 but with side reflectors 300 and 312 present. The distance between the side reflectors 300 and 312 and the nearest lamp in the lamp array 304 is preferably equal to or less than one half the inter-lamp spacing; however, other distances could be used.

It is evident from FIG. 4 that the use of side reflectors 300 and 312 allows the implementation of the UV exposure apparatus with a horizontal uniformity profile 360 at the target plane(s) 306 and 310 vastly superior to a system lacking side reflectors 300 and 312. This allows the operator to use a larger portion of the target plane(s) 306 and 310 at a higher average intensity, therefore increasing system throughput while maintaining system footprint.

In one embodiment, the apparatus includes additional lamps 302 and 309 near the edges of the lamp array 304, as shown in FIG. 2. These serve to increase the light intensity at the edges of the lamp array 304 and therefore compensate for intensity losses at the sides due to lower than ideal reflectance of the side reflectors 300 and 312.

Figure 5:
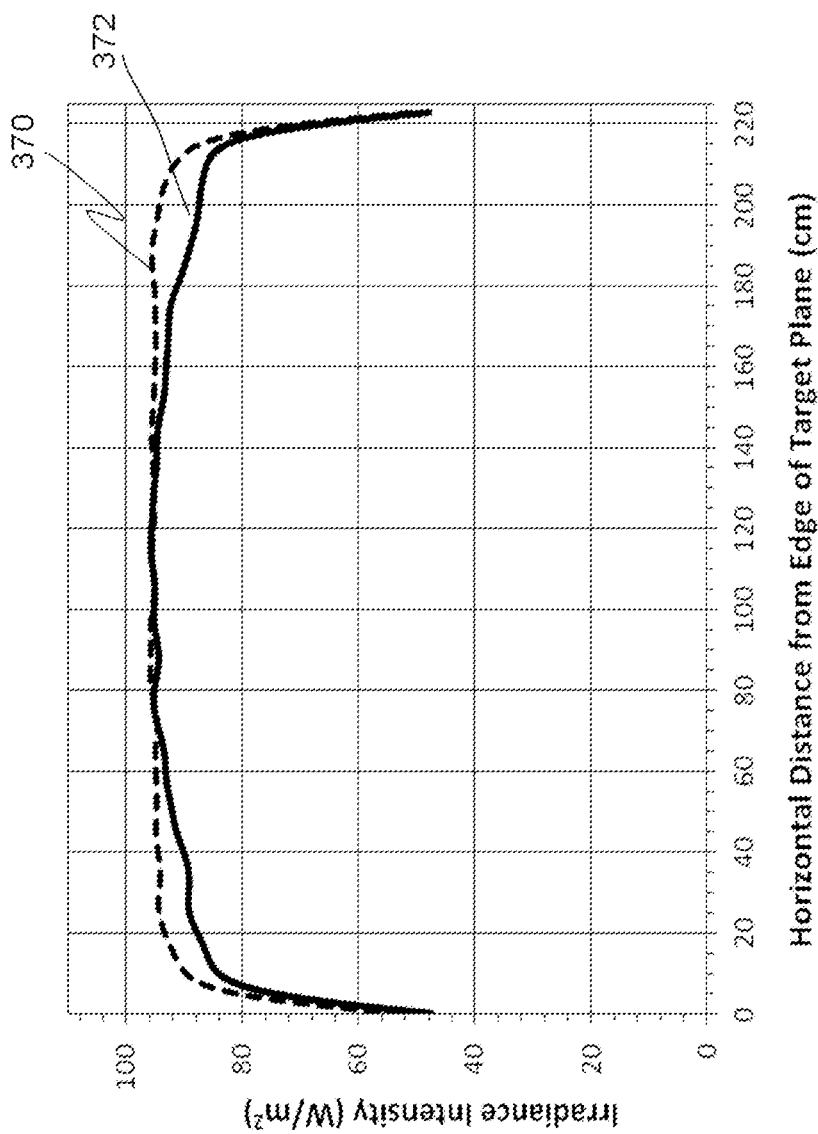
FIG. 5 depicts irradiance intensity profile curves at the target plane(s) of the UV exposure apparatus, contrasting results obtained with fluorescent tube lamps arranged in a coplanar array with results obtained from a similar lamp array, but in which lamps near the side reflectors are moved closer to the target plane(s).

FIG. 5 is an illustration produced with optical ray tracing software of the benefits of including additional lamps 302 and 309 closer to the target planes 306 and 310 at the edges of the lamp array 304. Curve 372 shows the horizontal intensity profile of the UV chamber with a single coplanar lamp array 304 in which each lamp is equidistant from the target plane(s) 306 and 310. Curve 370 shows the horizontal intensity profile of the UV chamber depicted in FIG. 2.

It is evident from FIG. 5 that reflective losses at the side reflectors 300 and 312 adversely affect the uniformity at the target plane(s) 306 and 310 when the lamp array 304 is arranged in a coplanar array. Moving lamps near the side reflectors 300 and 312 closer to the target plane(s) 306 and 310 addresses this issue, allowing a larger portion of the target plane(s) 306 and 310 to be used simultaneously and at a higher average intensity, therefore increasing system throughput while maintaining system footprint.

Vertical Irradiance Uniformity

Figure 6:
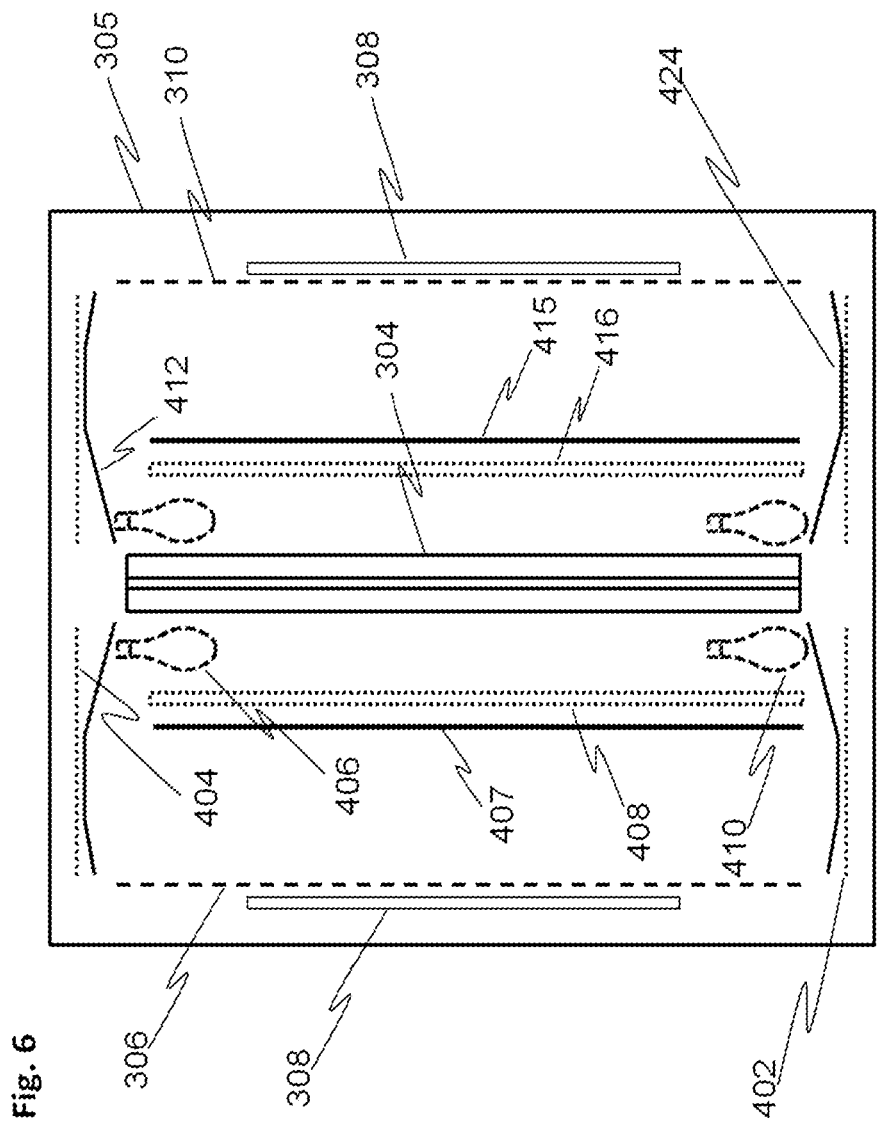
FIG. 6 depicts a cross-sectional side view of a UV exposure system with collections of flat top and bottom reflectors approximating curved reflectors according to the disclosed subject matter.

FIG. 6 depicts a cross sectional side view of an embodiment of the disclosed subject matter in which the top reflectors 412 and bottom reflectors 424 are collections of flat reflectors approximating curved reflectors.

An alternative embodiment of the top and bottom reflectors 412 and 424 is shown by flat top reflectors 404 and flat bottom reflectors 402.

Note that top and bottom reflectors (402, 404, 412, 424) appear on both sides of the chamber but only one of each is labeled in FIG. 6 for simplicity.

An alternative embodiment of the chamber 305 is shown in FIG. 6 with the inclusion of additional UV lamps 406 and 410 near the top and bottom of the lamp array 304. The additional top and bottom lamps 406 and 410 may, for example, also be HID lamps, arc, lamps, UV light emitting diodes, or others.

Because it is known that as a fluorescent tube lamp ages the intensity of the light near the top and bottom of the lamp decreases, the alternative embodiment of the chamber 305 shown in FIG. 6 with the inclusion of the additional UV lamps 406 and 410 would serve to improve the irradiance uniformity at the target planes 306 and 310 as the lamps in the lamp array 304 age.

FIG. 6 depicts yet another alternative embodiment of the chamber 305 in which optical diffusers 408 and 416 are placed between the lamp array 304 and the two target planes 306 and 310 in order to improve the irradiance uniformity of the UV light on the PV modules 308.

The optical diffusers 408 and 416 in FIG. 6 may, for example, be constructed of single or multiple frosted glass or quartz panels, wire mesh, translucent paper, etc.

Safety Shields

FIG. 6 also depicts another embodiment in which safety screens 407 and 415 are placed between the lamp array 304 and the two target planes 306 and 310.

The safety screens 407 and 415 shown in FIG. 6 protect against system operators falling into the chamber 305 and coming into contact with the lamp array 304 or allowing PV modules 308 to fall into the chamber and damage the lamp array 304 when the PV modules 308 are being loaded or unloaded. The safety screens 407 and 415 may, for example, be a wire mesh or other material.

Figure 7:
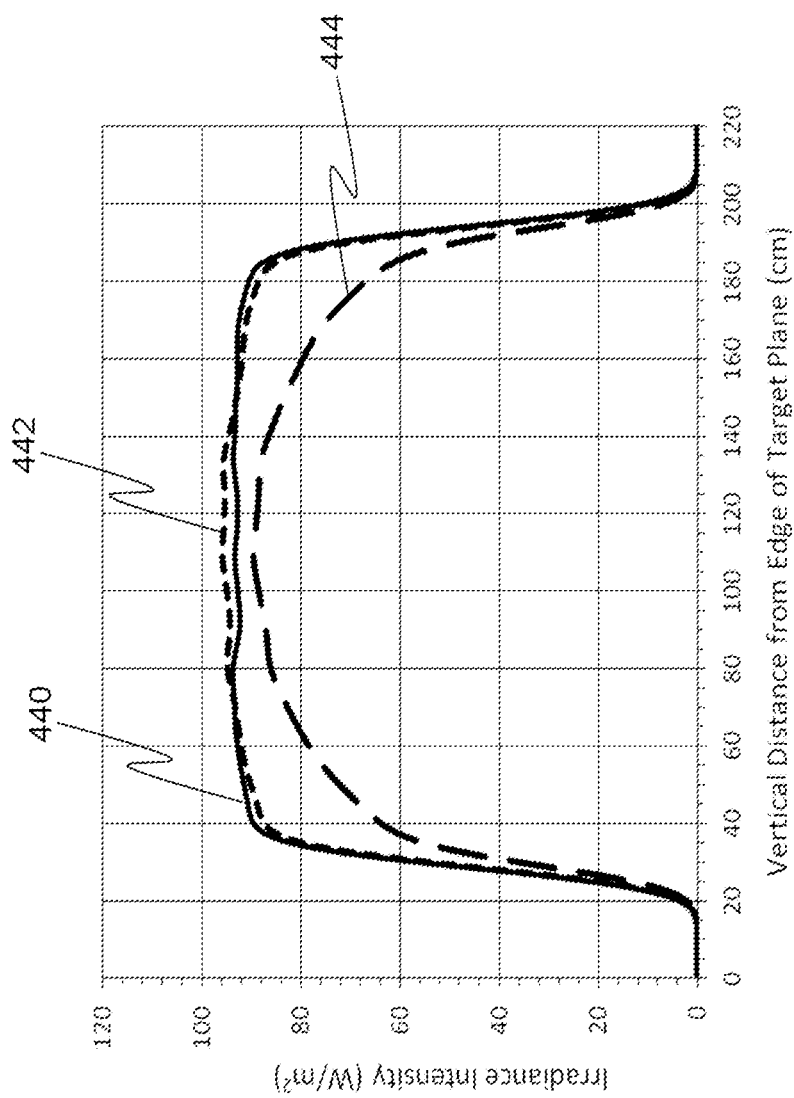
FIG. 7 depicts irradiance intensity profile curves at the target plane(s) of the UV exposure apparatus, contrasting results without top and bottom reflectors, with flat top and bottom reflectors, and with collections of flat top and bottom reflectors approximating curved reflectors.

Referring now to FIG. 7 which depicts three vertical irradiance intensity profiles 440, 442, and 444 of various embodiments of the top and bottom reflectors in the chamber 305. Curve 444 shows an irradiance profile with no top and bottom reflectors (402, 404, 412, 424). Curve 442 shows an irradiance profile with flat top and bottom reflectors 404 and 402. Curve 440 shows an irradiance profile of the chamber 305 with three flat reflectors approximating a curved top and bottom reflectors 412 and 424.

It is evident from FIG. 7 that the implementation of the chamber 305 with a collection of flat top and bottom reflectors approximating curved reflectors 412 and 424 serves to increase the uniformity of the vertical irradiance intensity profile.

Light Shields

Figure 8:
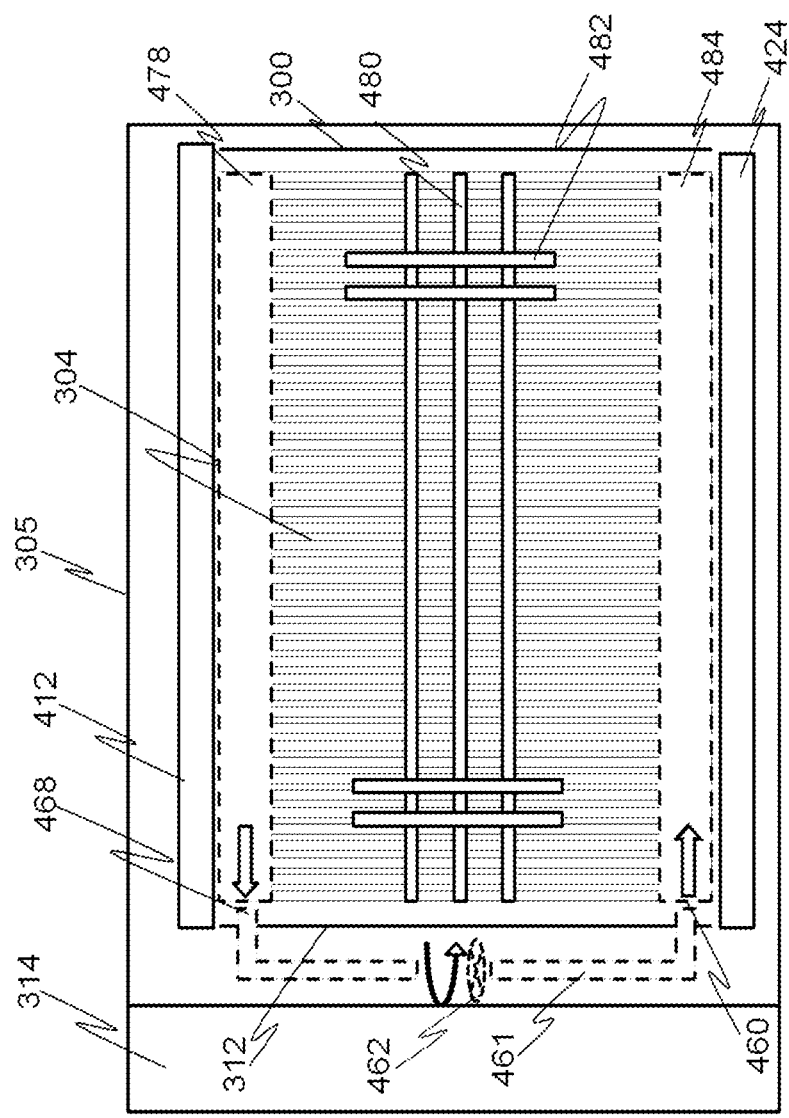
FIG. 8 depicts a cross sectional front view of a UV exposure system with opaque light shields of varying size and position interposed between the lamp array and the target plane(s) according to the disclosed subject matter.
Figure 1:
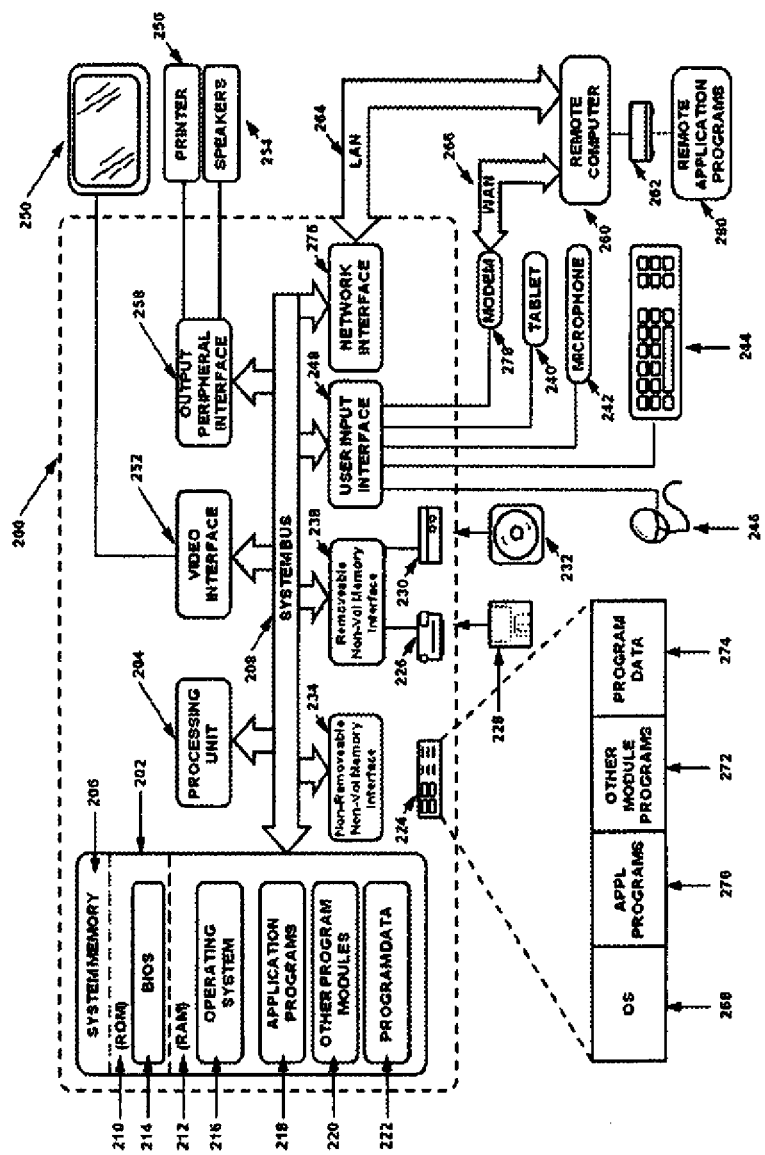
Figure 6:
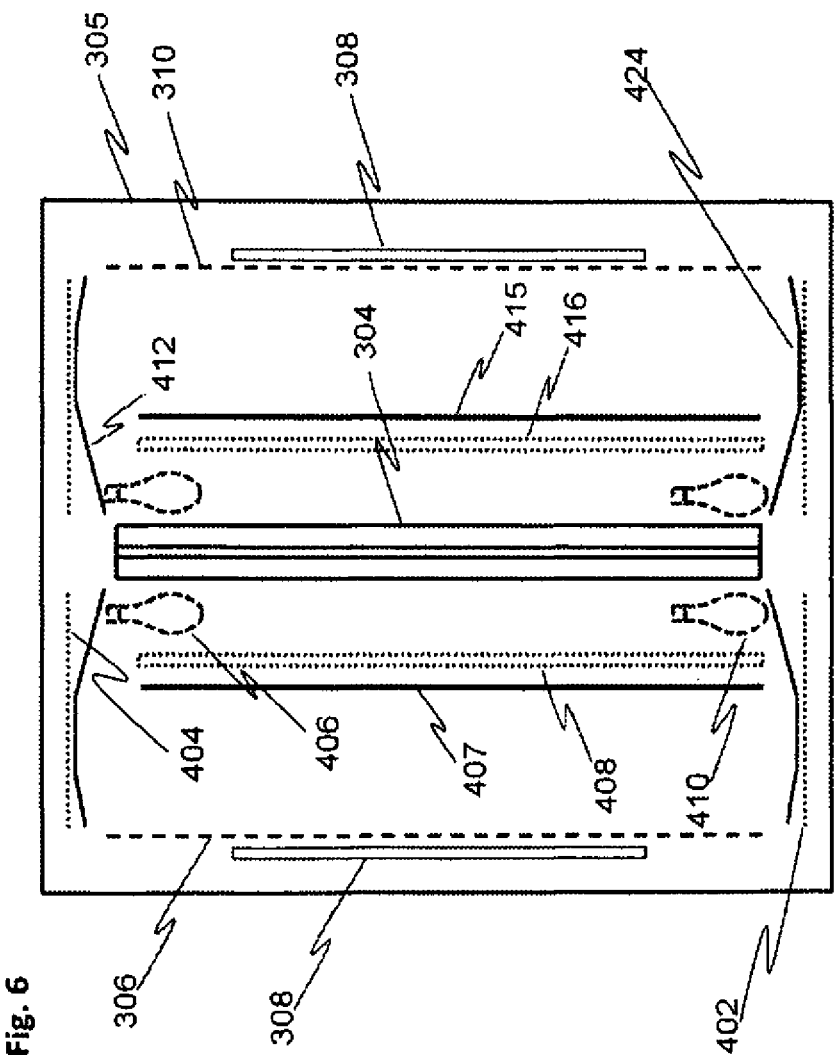

FIG. 8 depicts a cross sectional front view perpendicular to the lamp array 304 of one embodiment of the UV exposure system. This embodiment of the chamber 305 includes both horizontal opaque light shields 480 and vertical opaque light shields 482 that further improve the irradiance uniformity at the target plane(s) 306 and 310 by partially blocking the light from sections of the lamp array 304 responsible for localized irradiance intensity peaks at the target plane(s) 306 and 310.

In an alternative embodiment of the chamber 305, any of the position, size, and shape of the horizontal and vertical opaque light shields 480 and 482 may be easily or automatically adjusted as the lamps in the lamp array 304 age and the intensity profile along the lamp axis changes.

An alternative embodiment of the chamber 305 includes opaque light shields 478 and 484 to block light originating near the top and bottom of the lamp array 304 from reaching the target plane(s) 306 and 310.

The opaque light shields 478 and 484 may be desirable if the user wished to minimize any change in uniformity at the target plane(s) 306 and 310 as the lamps in the lamp array 304 age at the cost of either or both of a reduction in target plane 306 and 310 size or light intensity at the target plane(s) 306 and 310.

Air Recirculation

In one embodiment the chamber 305 as shown in FIG. 8 includes an air recirculation system 460, 461, 462, and 468 comprising at least one air inlet 468 near the top of the lamp array 304, at least one air outlet 460 near the bottom of the lamp array 304, a pathway for the air 461, and at least one device 462 (e.g., a fan or blower) that causes an air pressure differential between the air inlet 468 and air outlet 460.

The action of the device 462 causing an air pressure differential between the air inlet 468 and air outlet 462 in this embodiment may be automatically controlled by electronics housed in the electronics cabinet 314 or elsewhere.

The purpose of the air recirculation system 460, 461, 462, and 468 is to improve the temperature uniformity over the area of the PV modules 308.

UV Light Sensors

The UV exposure apparatus may include UV light sensors installed on or about the target plane(s) 306 and 310 to measure the intensity of the UV light exposing the test samples. Such light sensors may be, for example, UV-sensitive photodiodes. Because the sensitivity of the photodiodes and other similar light-detecting devices depends on temperature, each light sensor could also include a temperature sensor, such as a thermocouple, to measure the temperature of the light-sensitive device, e.g. the photodiode. The output of the light sensors, including temperature-dependent variations, could then be calibrated against a suitable reference device.

The apparatus preferably includes multiple UV light sensors at various locations on the target plane(s) 306 and 310, so that exposure uniformity may be confirmed during testing. Readings from the UV sensors are also used to continuously determine the elapsed UV exposure dose of the samples so that a computer control system can determine when testing has reached a desired dose level.

Exemplary Implementation

FIG. 9 shows an exemplary implementation of the UV exposure system. Some of its main elements include the chamber 305, lamp array 304, the electrical cabinet 314, the safety screen 407, opaque light shields of various sizes, shapes, and positions 480, an air outlet 460 that is part of the air recirculation system 460, 461, 462, and 468, cooling fans 512, flat side reflectors 300 and 312, and arrangements of flat reflectors approximating curved reflectors at the top 412 and bottom 424 of the UV exposure system.

In FIG. 9 the lamp array 304 results in significant heating of the chamber interior. The fans 512 draw air into the system for cooling, and may be automatically controlled via temperature sensors in the chamber, and control electronics in the electrical cabinet 314 to maintain the temperature of the PV module(s) 308, or some other measured temperature inside the chamber 305, at a predetermined point.

The exemplary implementation of the UV exposure system in FIG. 9, as shown, includes a linear array of vertically aligned fluorescent tube lamps which make up the lamp array 304. The lamps near the side reflectors 300 and 312 have been moved closer to the target planes 306 and 310 to take into account reflective losses at the side reflectors 300 and 312 and increase the irradiance intensity uniformity at the target plane(s) 306 and 310.

Although particularly described with reference to a specific number and/or type of light, other numbers and types of lights could be employed and remain within this disclosure. Furthermore, although particular reflective materials are described herein it should be appreciated that other materials could also be employed and remain within this disclosure. Additionally, although certain geometries and orientations of the lamp array and reflectors where particularly described, others could be used and remain within the scope of the disclosed subject matter.

In addition to the above described embodiments, those skilled in the art will appreciate that this disclosure has application in a variety of arts and situations and this disclosure is intended to include the same.

What is claimed is:

1. An apparatus for sing photovoltaic (PV) modules to ultraviolet light, comprising:
 a vertically oriented lamp array, said lamp array comprised of a plurality of ultraviolet (UV) light sources;
 at least one vertically oriented target plane; and
 at least one reflector, said at least one reflector oriented to direct UV light from said lamp array to said at least one target plane, wherein the distance from at least one of said at least one reflectors to the light emitting portion of the nearest UV light source or group of UV light sources is at most one half the spacing between said UV light sources.

2. An apparatus for sing photovoltaic (PV) modules to ultraviolet light, comprising:
 a vertically oriented lamp array, said lamp array comprised of a plurality of ultraviolet (UV) light sources;
 at least one vertically oriented target plane; and
 at least one reflector, said at least one reflector oriented to direct UV light from said lamp array to said at least one target plane, wherein the position of said UV light sources near the edge of said lamp array is closer to said at least one target plane than the position of said UV light sources near the center of said lamp array to provide enhanced exposure uniformity on said at least one target plane.

3. An apparatus for sing photovoltaic (PV) modules to ultraviolet light, comprising:
- a vertically oriented lamp array, said lamp array comprised of a plurality of ultraviolet (UV) light sources;
- at least one vertically oriented target plane;
- at least one reflector, said at least one reflector oriented to direct UV light from said lamp array to said at least one target plane; and
- one or more opaque light shields, said one or more opaque light shields disposed between said lamp array and said at least one target plane such that the intensity of said UV light is more uniform across said at least one target plane, wherein any one or more of the size, shape, and position of said one or more opaque light shields is automatically adjusted.

* * * * *

UNITED STATES PATENT AND TRADEMARK OFFICE
CERTIFICATE OF CORRECTION

PATENT NO. : 8,440,979 B2 Page 1 of 1
APPLICATION NO. : 13/124146
DATED : May 14, 2013
INVENTOR(S) : Michael Gostein et al.

It is certified that error appears in the above-identified patent and that said Letters Patent is hereby corrected as shown below:

On the title page item (75), Inventor's should read:

Michael Gostein  Austin, TX (US)
William Stueve   Austin, TX (US)
Lawrence Dunn   Austin, TX (US).

Signed and Sealed this
Twenty-seventh Day of May, 2014

Michelle K. Lee
*Deputy Director of the United States Patent and Trademark Office*

UNITED STATES PATENT AND TRADEMARK OFFICE
CERTIFICATE OF CORRECTION

PATENT NO. : 8,440,979 B2
APPLICATION NO. : 13/124146
DATED : May 14, 2013
INVENTOR(S) : Gostein et al.

It is certified that error appears in the above-identified patent and that said Letters Patent is hereby corrected as shown below:

> Please delete patent 8440979 in its entirety and insert patent 8440979 in its entirety as shown on the attached pages.

Signed and Sealed this
Twenty-third Day of December, 2014

Michelle K. Lee
*Deputy Director of the United States Patent and Trademark Office*

(12) United States Patent
Gostein et al.

(10) Patent No.: US 8,440,979 B2
(45) Date of Patent: May 14, 2013

(54) ULTRAVIOLET LIGHT EXPOSURE CHAMBER FOR PHOTOVOLTAIC MODULES

(75) Inventors: Michael Gostein, Austin, TX (US); William Stueve, Austin, TX (US); Lawrence R. Dunn, Austin, TX (US)

(73) Assignee: Atonometrics, Inc., Austin, TX (US)

(*) Notice: Subject to any disclaimer, the term of this patent is extended or adjusted under 35 U.S.C. 154(b) by 0 days.

(21) Appl. No.: 13/124,146

(22) PCT Filed: Oct. 16, 2009

(86) PCT No.: PCT/US2009/060967
§ 371 (c)(1),
(2), (4) Date: Apr. 18, 2011

(87) PCT Pub. No.: WO2010/045534
PCT Pub. Date: Apr. 22, 2010

(65) Prior Publication Data
US 2011/0198509 A1    Aug. 18, 2011

Related U.S. Application Data

(60) Provisional application No. 61/106,311, filed on Oct. 17, 2008.

(51) Int. Cl.
*G01J 1/42* (2006.01)

(52) U.S. Cl.
USPC .................................. 250/372

(58) Field of Classification Search
USPC .................................. 250/372
See application file for complete search history.

(56) References Cited

U.S. PATENT DOCUMENTS

| | | | |
|---|---|---|---|
| 5,054,480 A * | 10/1991 | Bare et al. | 128/201.25 |
| 5,372,781 A * | 12/1994 | Hallett et al. | 422/186.3 |
| 5,568,366 A * | 10/1996 | Jefferies | 362/1 |
| 6,033,459 A * | 3/2000 | Hase | 95/82 |
| 6,467,911 B1 * | 10/2002 | Ueyama et al. | 353/87 |
| 2006/0072314 A1 * | 4/2006 | Rains | 362/231 |
| 2007/0086009 A1 * | 4/2007 | Ebbets et al. | 356/402 |
| 2007/0228618 A1 * | 10/2007 | Kaszuba et al. | 264/494 |
| 2007/0287091 A1 * | 12/2007 | Jacobo et al. | 430/154 |
| 2009/0080215 A1 * | 3/2009 | Anandan | 362/606 |

FOREIGN PATENT DOCUMENTS

JP    2005253799 A  *  9/2005

* cited by examiner

*Primary Examiner* — Kiho Kim
(74) *Attorney, Agent, or Firm* — Hulsey, P.C.; Loren T. Smith; William N. Hulsey, III

(57) ABSTRACT

An apparatus for performing UV light exposure testing of solar panels, also known as PV modules, with superior exposure uniformity, equipment throughput, and floor space requirements, consisting of a chamber including a plurality of UV lamps in a lamp array, at least one target plane, and reflective panels positioned within the chamber to redirect UV light to the target plane(s).

3 Claims, 9 Drawing Sheets

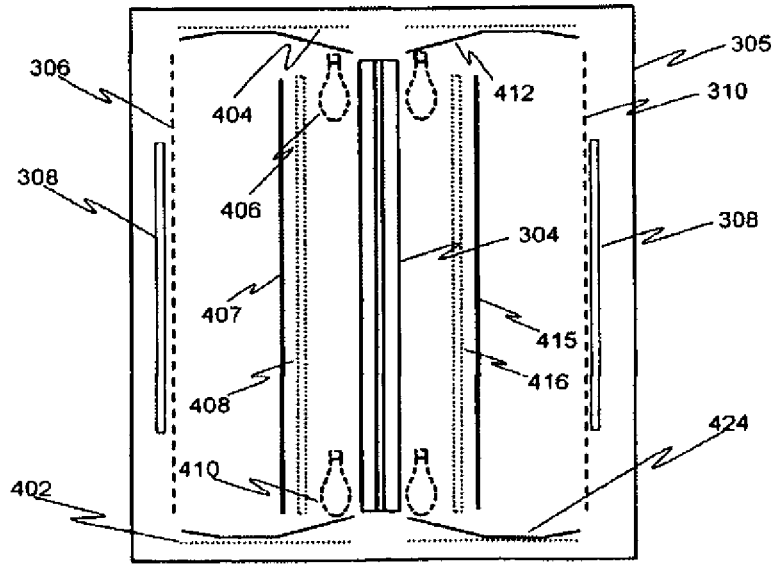

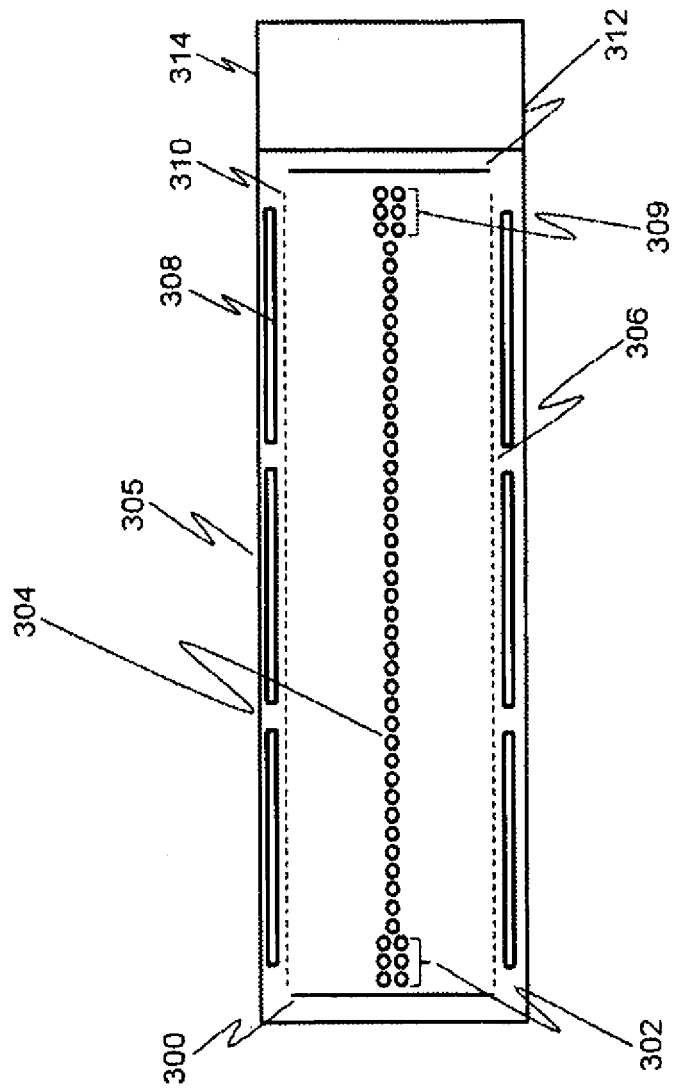

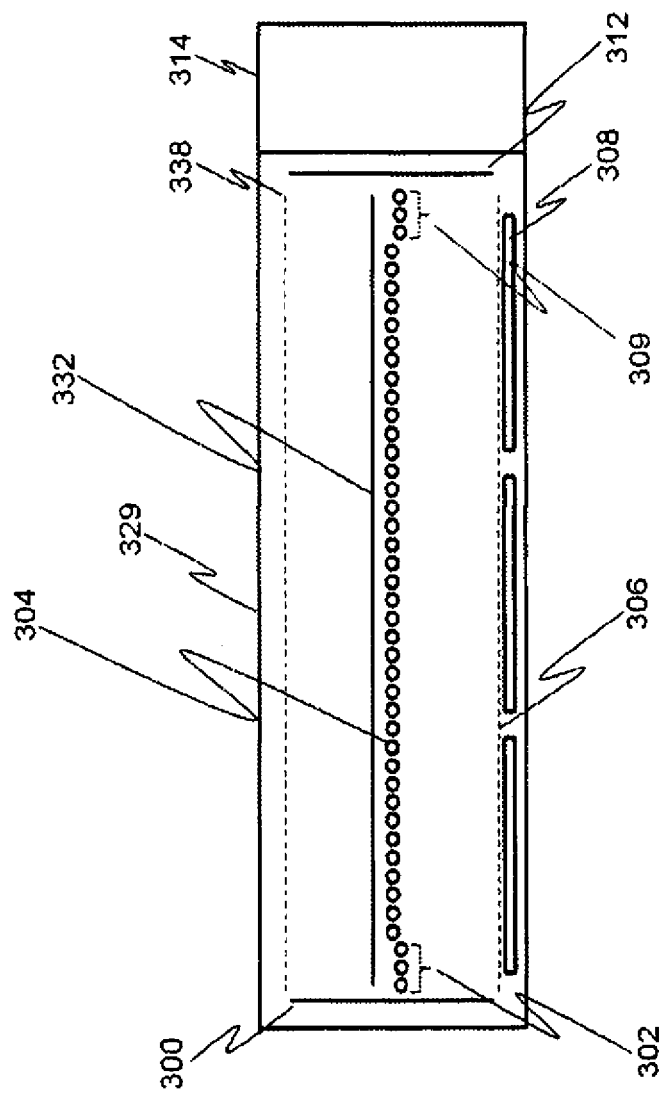

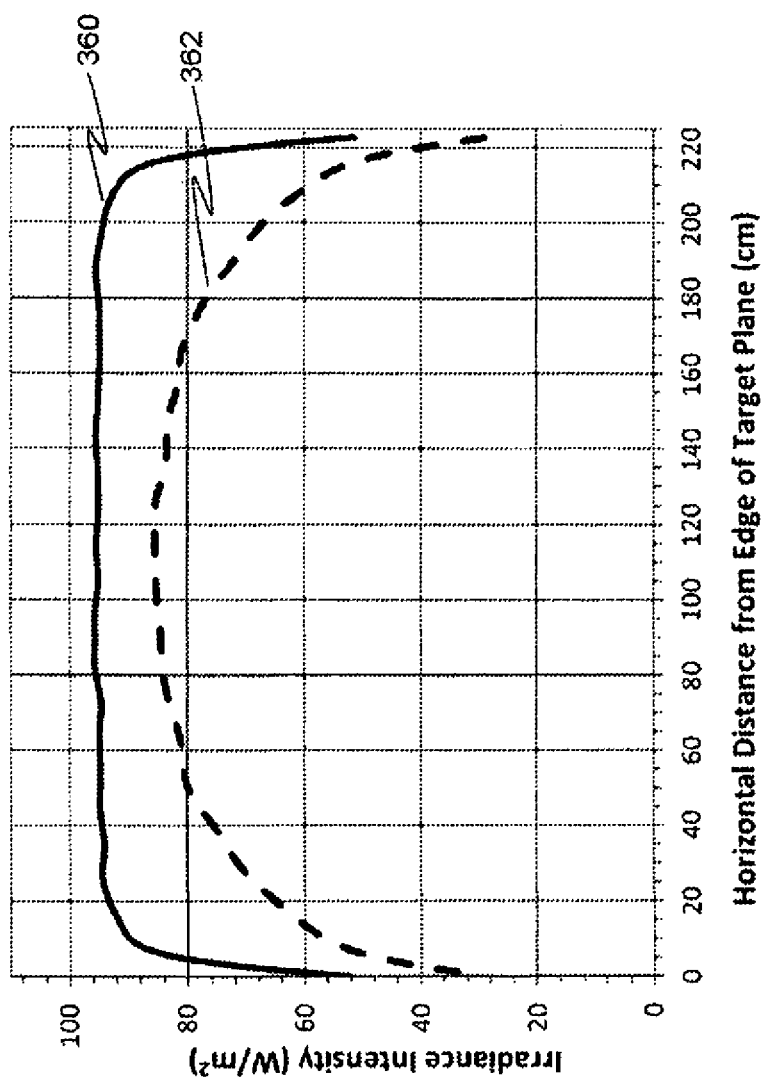

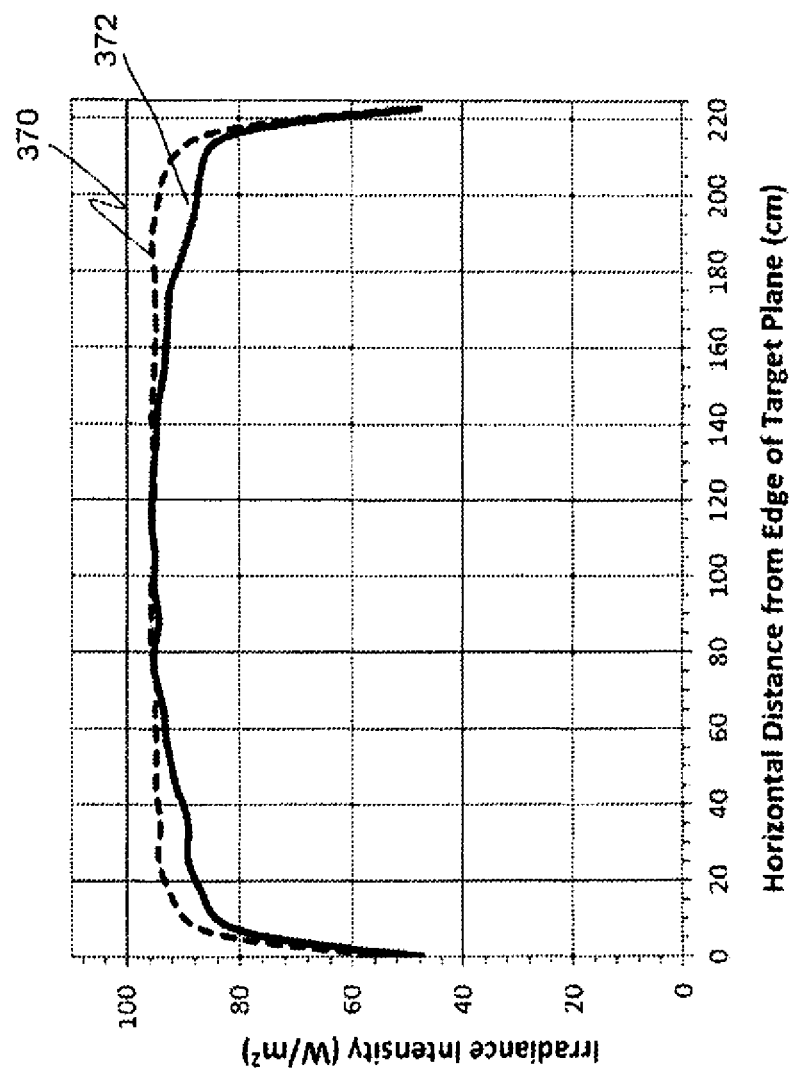

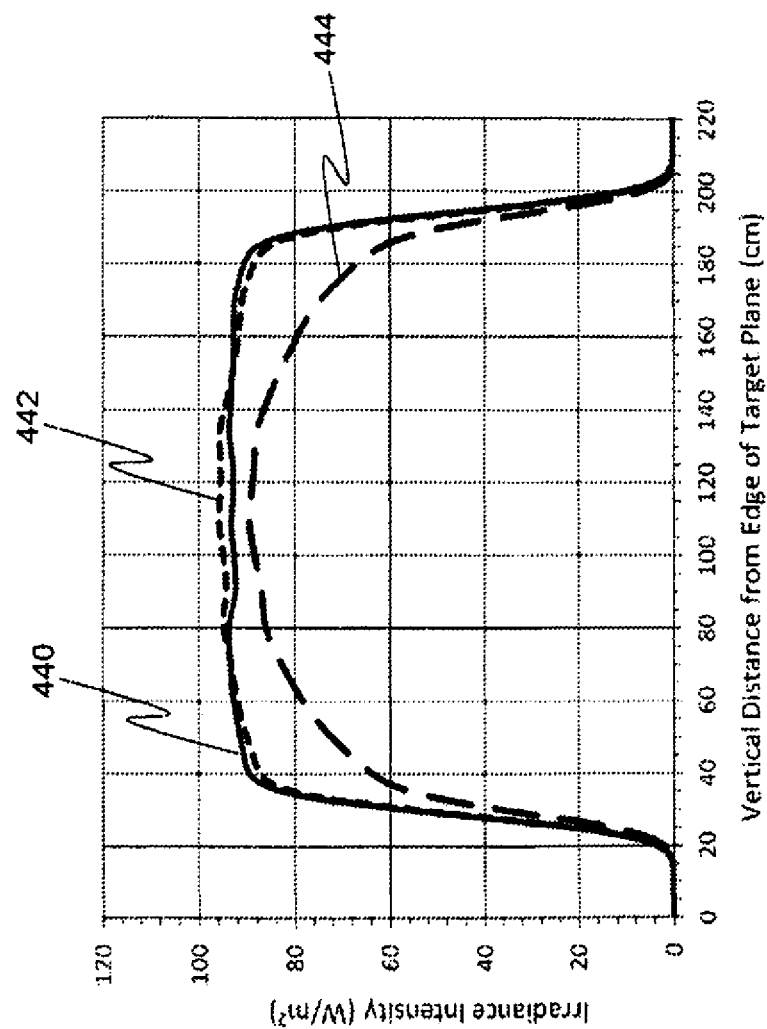

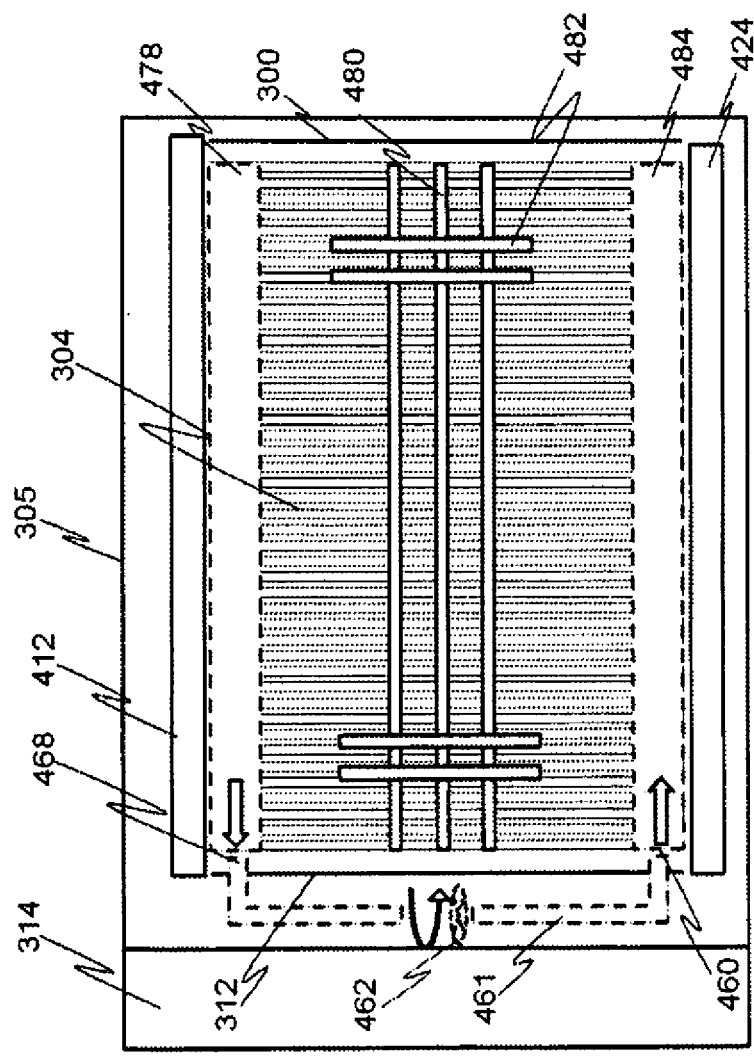

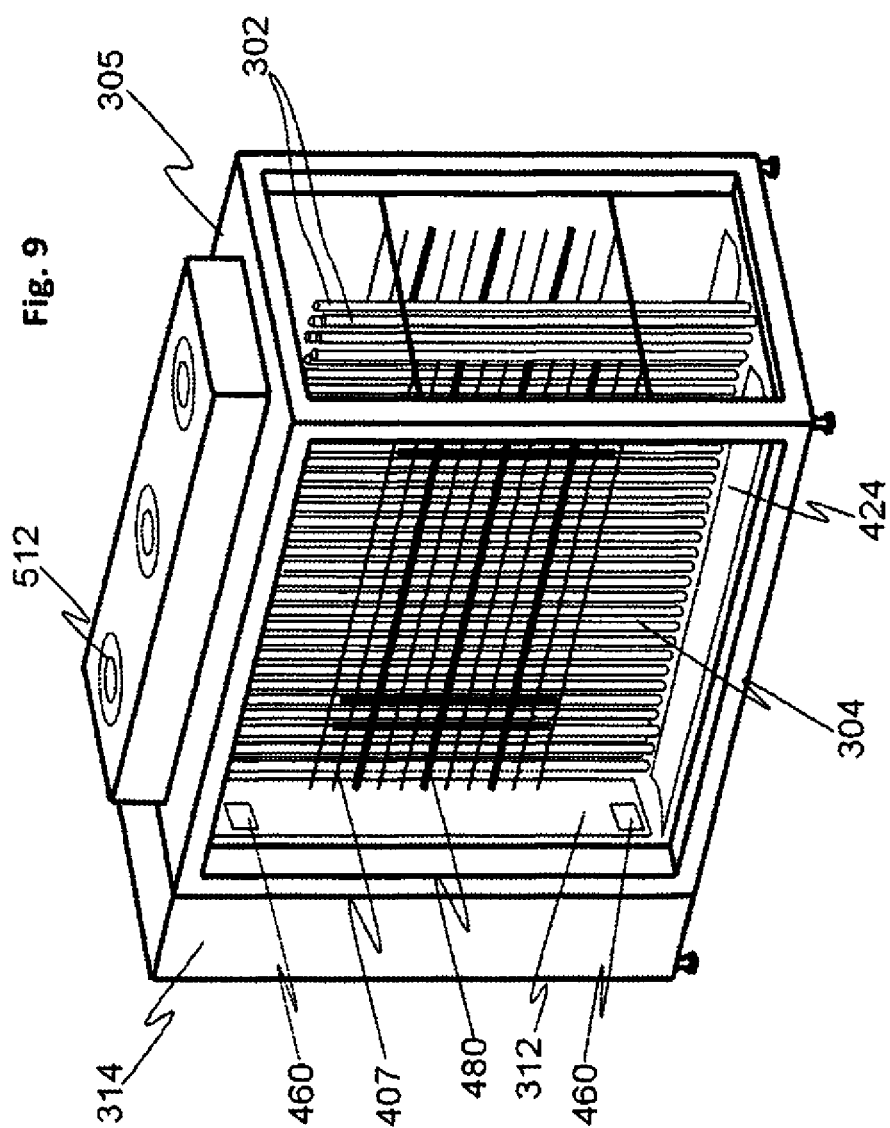

ULTRAVIOLET LIGHT EXPOSURE CHAMBER FOR PHOTOVOLTAIC MODULES

RELATED APPLICATION DATA

The present U.S. Utility Patent Application claims priority pursuant to 35 U.S.C. §371, as a national application, to the following International Application which is hereby incorporated herein by reference in its entirety and made part of the present U.S. Utility Patent Application for all purposes:

1. International Application Serial No. PCT/US2009/060967, entitled "ULTRAVIOLET LIGHT EXPOSURE CHAMBER FOR PHOTOVOLTAIC MODULES," filed Oct. 16, 2009, which claims priority pursuant to 35 U.S.C. §119(e) to the following U.S. Provisional Patent Application which is hereby incorporated herein by reference in its entirety and made part of the present U.S. Utility Patent Application for all purposes:

a. U.S. Provisional Application Ser. No. 61/106,311, entitled "ULTRAVIOLET LIGHT EXPOSURE CHAMBER FOR PHOTOVOLTAIC MODULES," filed Oct. 17, 2008, which is incorporated herein by reference.

FIELD OF THE INVENTION

The invention relates generally photovoltaic (PV) modules and more specifically to light exposure testing of solar panels.

BACKGROUND OF THE INVENTION

Manufacturers of solar panels, also known as photovoltaic (PV) modules, regularly subject their products to reliability tests intended to provide accelerated testing of degradation and failure modes. One important factor in various degradation and failure modes is exposure to ultraviolet (UV) radiation in sunlight, specifically in the UVA (320-400 nm) and UVB (280-320 nm) wavelength ranges.

PV manufacturers therefore include UV light exposure testing as part of their product reliability analysis. Indeed, UV exposure testing is required for PV module certification to industry standards such as International Electrotechnical Commission (IEC) 61215 and 61646, which are widely adopted. These standards call for exposure of PV modules to at least 15 kW-hr/m$^2$ of UVA and UVB radiation for approval of new product designs. It is widely acknowledged that actual UV exposures greatly exceed this level after only a few months of operation in the field. Therefore more extensive UV exposure testing is desirable.

However, existing UV exposure test equipment is not optimized for high-volume manufacturing requirements and is inadequate to meet the growing PV industry's testing needs. One issue is exposure uniformity. If uniformity is poor, either test quality is compromised or the exposure area must be over-sized compared to the test samples, resulting in higher cost per sample tested. Another issue is floor space. In some systems, modules under test are loaded horizontally onto a test table to be exposed by over-hanging UV lamps. For a large number of exposed modules, this requires significant floor space, since typical PV modules in use today have dimensions up to 1 m×1.6 m.

In view of the shortcomings of existing equipment, there is a need for an improved apparatus for UV exposure testing of PV modules.

BRIEF SUMMARY OF THE INVENTION

The disclosed subject matter provides an apparatus for performing UV light exposure testing of PV modules. It is an object of the disclosed subject matter to provide an apparatus for testing multiple PV modules with superior exposure uniformity, equipment throughput, and floor space requirements.

The apparatus comprises a chamber including a vertically oriented array of UV lamps, at least one vertically oriented target plane for placing PV modules under test, and panels reflective to UV radiation positioned around the sides of the exposure area. The vertical orientation of the lamp array and target planes reduces the floor space requirements of the system. The reflective panels improve exposure uniformity, allowing efficient use of the UV lamps.

In one embodiment, the apparatus includes only one target plane on one side of the lamp array and a back-reflector on the other side of the lamp array to direct light to the one target plane.

In another embodiment, the apparatus includes two target planes, one on either side of the lamp array. The use of two target planes reduces the UV exposure intensity that may be achieved at one test sample as compared with the embodiment involving one target plane only and a back-reflector positioned behind the lamps. However, the reduction in exposure intensity is less than a factor of two—since the efficiency of a back reflector is less than 100%—while the additional target plane allows simultaneous exposure of twice as many samples.

In yet another embodiment, a system designed to use two target planes may be operated with test modules mounted on one target plane only. Reflectors could be included on at least one of the target planes so that when no test modules are present on that plane, light intensity at the other plane is increased and testing is accelerated.

In one embodiment, the reflective panels include flat side reflectors and/or flat top and bottom reflectors. Side reflectors provide for improved horizontal uniformity of UV irradiance at the target plane(s), while top and bottom reflectors provide for improved vertical uniformity of UV irradiance at the target plane(s).

In an alternative embodiment, the system includes curved reflectors (or collections of flat reflectors approximating curved reflectors) at the top and bottom of the chamber to provide for improved vertical uniformity of UV irradiance at the target plane(s) compared to flat top and bottom reflectors by increasing the irradiance intensity near the top and bottom of the target plane(s) and decreasing the irradiance intensity near the center of the target plane(s).

In one embodiment, lamps near each side reflector are positioned closer to the target plane(s) than lamps in the interior portion of the lamp array, providing improved horizontal uniformity of the UV irradiance at the target plane(s) by compensating for reflective losses at the side reflectors.

The distance between the lamp array and the target plane(s) is chosen to further optimize uniformity, taking into account potential non-uniformities in the lamp intensities. The distance is chosen to be between 4 and 12 times the spacing between lamps in the lamp array; however other spacings are possible.

In one embodiment, the system includes opaque light shields of various size and shape positioned between the lamp array and the target plane(s), to provide for improved irradiance uniformity at the target plane(s) by partially blocking the light from portions of the lamp array responsible for localized irradiance peaks at the target plane(s).

Optionally, the system may be operated with a portion of the lamp array unused. Furthermore, additional reflectors may be added to the system to improve intensity and uniformity when a portion of the lamp array is not used.

In one embodiment, the system includes a diffusing material interposed between the lamp array and the target plane(s) to improve irradiance uniformity at the target plane(s).

In another embodiment, the system includes multiple UV lamp types in order to optimize the spectral distribution of the emitted light for a given test purpose or to reduce the cost to achieve a given spectral requirement by combining low-cost lamps with high-cost lamps.

These and other aspects of the disclosed subject matter, as well as additional novel features, will be apparent from the description provided herein. The intent of this summary is not to be a comprehensive description of the claimed subject matter, but rather to provide a short overview of some of the subject matter's functionality. Other systems, methods, features and advantages here provided will become apparent to one with skill in the art upon examination of the following FIGUREs and detailed description. It is intended that all such additional systems, methods, features and advantages that are included within this description, be within the scope of the claims.

BRIEF DESCRIPTIONS OF THE DRAWINGS

The novel features believed characteristic of the invention will be set forth in the claims. The invention itself, however, as well as a preferred mode of use, further objectives, and advantages thereof, will best be understood by reference to the following detailed description of illustrative embodiments when read in conjunction with the accompanying drawings, wherein:

FIG. 1 depicts an exemplary computer system with which the disclosed subject matter could be utilized.

FIG. 2 depicts a cross sectional top view of a UV exposure apparatus with two target planes according to the disclosed subject matter.

FIG. 3 depicts a cross sectional top down view of a UV exposure apparatus with a single target plane according to the disclosed subject matter.

FIG. 4 depicts irradiance intensity profile curves at the target plane(s) of the UV exposure apparatus, contrasting results with and without side reflectors.

FIG. 5 depicts irradiance intensity profile curves at the target plane(s) of the UV exposure apparatus, contrasting results obtained with fluorescent tube lamps arranged in a coplanar array with results obtained from a similar lamp array, but in which lamps near the side reflectors are moved closer to the target plane(s).

FIG. 6 depicts a cross-sectional side view of a UV exposure system with collections of flat top and bottom reflectors approximating curved reflectors according to the disclosed subject matter.

FIG. 7 depicts irradiance intensity profile curves at the target plane(s) of the UV exposure apparatus, contrasting results without top and bottom reflectors, with flat top and bottom reflectors, and with collections of flat top and bottom reflectors approximating curved reflectors.

FIG. 8 depicts a cross sectional front view of a UV exposure system with opaque light shields of varying size and position interposed between the lamp array and the target plane(s) according to the disclosed subject matter.

FIG. 9 depicts the layout of an exemplary UV exposure testing apparatus according to the disclosed subject matter.

DETAILED DESCRIPTION OF ILLUSTRATIVE EMBODIMENTS

Although described with particular reference to UV testing of photovoltaic modules, those with skill in the arts will recognize that the disclosed embodiments have relevance to a wide variety of areas in addition to those specific examples described below.

All references, including publications, patent applications, and patents, cited herein are hereby incorporated by reference to the same extent as if each reference were individually and specifically indicated to be incorporated by reference and were set forth in its entirety herein.

Computing System

With reference to FIG. 1, an exemplary system within a computing environment for implementing the invention includes a general purpose computing device in the form of a computing system 200, commercially available from Intel, IBM, AMD, Motorola, Cyrix and others. Components of the computing system 202 may include, but are not limited to, a processing unit 204, a system memory 206, and a system bus 236 that couples various system components including the system memory to the processing unit 204. The system bus 236 may be any of several types of bus structures including a memory bus or memory controller, a peripheral bus, and a local bus using any of a variety of bus architectures.

Computing system 200 typically includes a variety of computer readable media. Computer readable media can be any available media that can be accessed by the computing system 200 and includes both volatile and nonvolatile media, and removable and non-removable media. By way of example, and not limitation, computer readable media may comprise computer storage media and communication media. Computer storage media includes volatile and nonvolatile, removable and non-removable media implemented in any method or technology for storage of information such as computer readable instructions, data structures, program modules or other data.

Computer memory includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by the computing system 200.

The system memory 206 includes computer storage media in the form of volatile and/or nonvolatile memory such as read only memory (ROM) 210 and random access memory (RAM) 212. A basic input/output system 214 (BIOS), containing the basic routines that help to transfer information between elements within computing system 200, such as during start-up, is typically stored in ROM 210. RAM 212 typically contains data and/or program modules that are immediately accessible to and/or presently being operated on by processing unit 204. By way of example, and not limitation, an operating system 216, application programs 220, other program modules 220 and program data 222 are shown.

Computing system 200 may also include other removable/non-removable, volatile/nonvolatile computer storage media. By way of example only, a hard disk drive 224 that reads from or writes to non-removable, nonvolatile magnetic media, a magnetic disk drive 226 that reads from or writes to a removable, nonvolatile magnetic disk 228, and an optical disk drive 230 that reads from or writes to a removable, nonvolatile optical disk 232 such as a CD ROM or other optical media could be employed to store some portion of the disclosed subject matter. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The hard disk drive 224 is typically connected to the system bus 236 through a non-removable memory interface such as interface 234, and magnetic disk drive 226 and optical disk drive 230 are typically connected to the system bus 236 by a removable memory interface, such as interface 238.

The drives and their associated computer storage media, discussed above, provide storage of computer readable instructions, data structures, program modules and other data for the computing system 200. For example, hard disk drive 224 is illustrated as storing operating system 268, application programs 270, other program modules 272 and program data 274. Note that these components can either be the same as or different from operating system 216, application programs 220, other program modules 220, and program data 222. Operating system 268, application programs 270, other program modules 272, and program data 274 are given different numbers hereto illustrates that, at a minimum, they are different copies.

A user may enter commands and information into the computing system 200 through input devices such as a tablet, or electronic digitizer, 240, a microphone 242, a keyboard 244, and pointing device 246, commonly referred to as a mouse, trackball, or touch pad. These and other input devices are often connected to the processing unit 204 through a user input interface 248 that is coupled to the system bus 208, but may be connected by other interface and bus structures, such as a parallel port, game port or a universal serial bus (USB).

A monitor 250 or other type of display device is also connected to the system bus 208 via an interface, such as a video interface 252. The monitor 250 may also be integrated with a touch-screen panel or the like. Note that the monitor and/or touch screen panel can be physically coupled to a housing in which the computing system 200 is incorporated, such as in a tablet-type personal computer. In addition, computers such as the computing system 200 may also include other peripheral output devices such as speakers 254 and printer 256, which may be connected through an output peripheral interface 258 or the like.

Computing system 200 may operate in a networked environment using logical connections to one or more remote computers, such as a remote computing system 260. The remote computing system 260 may be a personal computer, a server, a router, a network PC, a peer device or other common network node, and typically includes many or all of the elements described above relative to the computing system 200, although only a memory storage device 262 has been illustrated. The logical connections depicted include a local area network (LAN) 264 connecting through network interface 276 and a wide area network (WAN) 266 connecting via modem 278, but may also include other networks. Such networking environments are commonplace in offices, enterprise-wide computer networks, intranets and the Internet.

The central processor operating pursuant to operating system software such as IBM OS/2®, Linux®, UNIX®, Microsoft Windows®, Apple Mac OSX® and other commercially available operating systems provides functionality for some of the features provided by the present invention. The operating system or systems may reside at a central location or distributed locations (i.e., mirrored or standalone).

Software programs or modules instruct the operating systems to perform tasks such as, but not limited to, facilitating client requests, system maintenance, security, data storage, data backup, data mining, document/report generation and algorithms. The provided functionality may be embodied directly in hardware, in a software module executed by a processor or in any combination of the two.

Furthermore, software operations may be executed, in part or wholly, by one or more servers or a client's system, via hardware, software module or any combination of the two. A software module (program or executable) may reside in RAM memory, flash memory, ROM memory, EPROM memory, EEPROM memory, registers, hard disk, a removable disk, a CD-ROM, DVD, optical disk or any other form of storage medium known in the art. An exemplary storage medium is coupled to the processor such that the processor can read information from, and write information to, the storage medium. In the alternative, the storage medium may be integral to the processor. The processor and the storage medium may also reside in an application specific integrated circuit (ASIC). The bus may be an optical or conventional bus operating pursuant to various protocols that are well known in the art.

Irradiance Uniformity at the Target Plane

Referring generally to FIG. 2, one of the primary challenges addressed with the disclosed UV exposure apparatus is that of achieving a suitable uniformity of irradiance intensity at the target plane(s) 306 and 310. For example, IEC standards 61215 and 61646 for testing of PV modules require UV testing with an irradiance uniformity of +/−15% or better over the area of the PV module(s) under test. It is desirable that test equipment will have even better uniformity, +/−10% or better.

Obtaining desirable exposure uniformity while optimizing cost is difficult for several reasons. One simple approach to obtaining desired uniformity is to over-size the test area, so that uniformity is adequate over a limited area corresponding to the devices to be tested. However, it is desirable to use as few lamps as possible to reduce system footprint, operating cost, and consumables cost. Therefore, alternative solutions are preferred.

Basic Design

In the UV exposure apparatus, the target planes 306 and 310 are oriented vertically. This reduces the floor space requirements as compared with a horizontal target plane orientation; however, a horizontal or other orientation could be used. In addition, in one embodiment, the use of two target planes 306 and 310 on opposite sides of the lamp array 304 reduces the space requirements of the apparatus as compared to an apparatus with a single target plane 330 (not shown) of the same total area.

UV fluorescent tube lamps provide a convenient UV light source. Suitable lamps include nominally 72 inch long 1.5 inch diameter 85/100 W high-output fluorescent tubes. These lamps are available in various types that emit in different wavelength ranges, including broadband UVA types (often designated F72T12-BL-HO) and broadband UVB types (often designated FS72T12-UVB-HO). Suppliers include Solarc Systems, National Biological Corporation, and many others. These lamps typically emit 5 to 25 W of UV radiation per lamp. Although specific lamps are described, other could be used.

Alternative UV light sources include HID lamps, arc, lamps, UV light emitting diodes, etc.

In the UV exposure apparatus, the lamp array 304 is housed in a chamber 305 which includes various reflective surfaces (e.g., side reflectors 300 and 312) which are highly reflective to UV light. An example of a suitable reflector material is Anolux UVS material produced by ALANOD Aluminium-Veredlung GmbH & Co. KG; however other materials could be used. This material has an average reflectance of ~83% in the UV wavelength range from 250 nm to 500 nm. The size, position, and orientation of the reflective surfaces will depend on the reflectance of the reflective material.

Continuing with FIG. 2, which illustrates a top down cross sectional view of a UV exposure system consisting of a chamber 305 including an array of lamps 304 illuminating two target planes 310 and 306 with one or more PV modules 308. The figure is intended to illustrate a design with 50 UV fluorescent tube lamps 304, each of which extends in a direction perpendicular to the cross-section plane; however, more or less lamps in perpendicular or other arrangements/geometries could be used. Finally, an electronics cabinet 314 is provided for control systems or other items.

In one embodiment, the apparatus includes additional lamps 302 and 309 near the edges of the lamp array 304, as shown in FIG. 2. These serve to increase the light intensity at the edges of the lamp array 304 and therefore compensate for intensity losses at the sides due to lower than ideal reflectance of the side reflectors 300 and 312.

FIG. 3 illustrates top down cross sectional view of an alternative embodiment of the UV exposure apparatus including a "back reflector" 332 behind the lamp array 304 in order to direct more UV light to a single target plane 306.

The embodiment shown in FIG. 3 may be advantageous if the system operator wishes to expose the PV modules 308 at one target plane 306 to a predetermined dose of UV radiation at an accelerated rate. With an 83% reflectance of the back reflector 332, one would expect this embodiment of the UV exposure apparatus to expose the PV modules 308 to a specified dose of UV radiation in a time, t1, that is about (1/1.83) =0.546 of the time, t2, required to obtain the same dose of radiation with two target planes 306 and 310, as discussed in reference to FIG. 2. However, absorption of UV radiation by the lamp tubes after reflection from the back reflector 332 may degrade this performance.

Referring generally to both FIGS. 2 and 3, achieving desirable irradiance uniformity at the target plane(s) 306 and 310 with fluorescent tube lamps is complicated by the fact that a fluorescent tube lamp is typically brightest in the center, and dimmest near the electrical connectors at each end of the lamp.

The uniformity of the intensity at the target plane(s) 306 and 310 is a function of the target plane's 306 and 310 distance, D, from the lamp array 304. For a vertical array of fluorescent tube lamps with a diameter of 1.5", a ratio of D to the inter-lamp spacing within the lamp array of between 4 and 12 allows for reasonable magnitudes of intensity to be reached at the target plane(s) 306 and 310, reasonable non-uniformities to be tolerated in lamp irradiance along the vertical lamp axis, and an acceptable footprint size of the system to be achieved. For the system of FIG. 2, exemplary dimensions are an interlamp spacing of 2.0" and lamp array to target plane spacing, D, of ~18.8".

Horizontal Irradiance Uniformity

FIG. 4 shows an illustration of the benefits of using side reflectors 300 and 312 obtained from ray tracing modeling of the UV exposure apparatus similar to that shown in FIG. 2. Curve 362 is an example of a horizontal intensity profile of the UV chamber 305 depicted in FIG. 2 but without the side reflectors 300 and 312. Curve 360 is an example of a horizontal intensity profile of the UV chamber 305 depicted in FIG. 2 but with side reflectors 300 and 312 present. The distance between the side reflectors 300 and 312 and the nearest lamp in the lamp array 304 is preferably equal to or less than one half the inter-lamp spacing; however, other distances could be used.

It is evident from FIG. 4 that the use of side reflectors 300 and 312 allows the implementation of the UV exposure apparatus with a horizontal uniformity profile 360 at the target plane(s) 306 and 310 vastly superior to a system lacking side reflectors 300 and 312. This allows the operator to use a larger portion of the target plane(s) 306 and 310 at a higher average intensity, therefore increasing system throughput while maintaining system footprint.

In one embodiment, the apparatus includes additional lamps 302 and 309 near the edges of the lamp array 304, as shown in FIG. 2. These serve to increase the light intensity at the edges of the lamp array 304 and therefore compensate for intensity losses at the sides due to lower than ideal reflectance of the side reflectors 300 and 312.

FIG. 5 is an illustration produced with optical ray tracing software of the benefits of including additional lamps 302 and 309 closer to the target planes 306 and 310 at the edges of the lamp array 304. Curve 372 shows the horizontal intensity profile of the UV chamber with a single coplanar lamp array 304 in which each lamp is equidistant from the target plane(s) 306 and 310. Curve 370 shows the horizontal intensity profile of the UV chamber depicted in FIG. 2.

It is evident from FIG. 5 that reflective losses at the side reflectors 300 and 312 adversely affect the uniformity at the target plane(s) 306 and 310 when the lamp array 304 is arranged in a coplanar array. Moving lamps near the side reflectors 300 and 312 closer to the target plane(s) 306 and 310 addresses this issue, allowing a larger portion of the target plane(s) 306 and 310 to be used simultaneously and at a higher average intensity, therefore increasing system throughput while maintaining system footprint.

Vertical Irradiance Uniformity

FIG. 6 depicts a cross sectional side view of an embodiment of the disclosed subject matter in which the top reflectors 412 and bottom reflectors 424 are collections of flat reflectors approximating curved reflectors.

An alternative embodiment of the top and bottom reflectors 412 and 424 is shown by flat top reflectors 404 and flat bottom reflectors 402.

Note that top and bottom reflectors (402, 404, 412, 424) appear on both sides of the chamber but only one of each is labeled in FIG. 6 for simplicity.

An alternative embodiment of the chamber 305 is shown in FIG. 6 with the inclusion of additional UV lamps 406 and 410 near the top and bottom of the lamp array 304. The additional top and bottom lamps 406 and 410 may, for example, also be HID lamps, arc, lamps, UV light emitting diodes, or others.

Because it is known that as a fluorescent tube lamp ages the intensity of the light near the top and bottom of the lamp decreases, the alternative embodiment of the chamber 305 shown in FIG. 6 with the inclusion of the additional UV lamps 406 and 410 would serve to improve the irradiance uniformity at the target planes 306 and 310 as the lamps in the lamp array 304 age.

FIG. 6 depicts yet another alternative embodiment of the chamber 305 in which optical diffusers 408 and 416 are placed between the lamp array 304 and the two target planes 306 and 310 in order to improve the irradiance uniformity of the UV light on the PV modules 308.

The optical diffusers 408 and 416 in FIG. 6 may, for example, be constructed of single or multiple frosted glass or quartz panels, wire mesh, translucent paper, etc.

Safety Shields

FIG. 6 also depicts another embodiment in which safety screens 407 and 415 are placed between the lamp array 304 and the two target planes 306 and 310.

The safety screens 407 and 415 shown in FIG. 6 protect against system operators falling into the chamber 305 and coming into contact with the lamp array 304 or allowing PV modules 308 to fall into the chamber and damage the lamp array 304 when the PV modules 308 are being loaded or unloaded. The safety screens 407 and 415 may, for example, be a wire mesh or other material.

Referring now to FIG. 7 which depicts three vertical irradiance intensity profiles 440, 442, and 444 of various embodiments of the top and bottom reflectors in the chamber 305. Curve 444 shows an irradiance profile with no top and bottom reflectors (402, 404, 412, 424). Curve 442 shows an irradiance profile with flat top and bottom reflectors 404 and 402. Curve 440 shows an irradiance profile of the chamber 305 with three flat reflectors approximating a curved top and bottom reflectors 412 and 424.

It is evident from FIG. 7 that the implementation of the chamber 305 with a collection of flat top and bottom reflectors approximating curved reflectors 412 and 424 serves to increase the uniformity of the vertical irradiance intensity profile.

Light Shields

FIG. 8 depicts a cross sectional front view perpendicular to the lamp array 304 of one embodiment of the UV exposure system. This embodiment of the chamber 305 includes both horizontal opaque light shields 480 and vertical opaque light shields 482 that further improve the irradiance uniformity at the target plane(s) 306 and 310 by partially blocking the light from sections of the lamp array 304 responsible for localized irradiance intensity peaks at the target plane(s) 306 and 310.

In an alternative embodiment of the chamber 305, any of the position, size, and shape of the horizontal and vertical opaque light shields 480 and 482 may be easily or automatically adjusted as the lamps in the lamp array 304 age and the intensity profile along the lamp axis changes.

An alternative embodiment of the chamber 305 includes opaque light shields 478 and 484 to block light originating near the top and bottom of the lamp array 304 from reaching the target plane(s) 306 and 310.

The opaque light shields 478 and 484 may be desirable if the user wished to minimize any change in uniformity at the target plane(s) 306 and 310 as the lamps in the lamp array 304 age at the cost of either or both of a reduction in target plane 306 and 310 size or light intensity at the target plane(s) 306 and 310.

Air Recirculation

In one embodiment the chamber 305 as shown in FIG. 8 includes an air recirculation system 460, 461, 462, and 468 comprising at least one air inlet 468 near the top of the lamp array 304, at least one air outlet 460 near the bottom of the lamp array 304, a pathway for the air 461, and at least one device 462 (e.g., a fan or blower) that causes an air pressure differential between the air inlet 468 and air outlet 460.

The action of the device 462 causing an air pressure differential between the air inlet 468 and air outlet 462 in this embodiment may be automatically controlled by electronics housed in the electronics cabinet 314 or elsewhere.

The purpose of the air recirculation system 460, 461, 462, and 468 is to improve the temperature uniformity over the area of the PV modules 308.

UV Light Sensors

The UV exposure apparatus may include UV light sensors installed on or about the target plane(s) 306 and 310 to measure the intensity of the UV light exposing the test samples. Such light sensors may be, for example, UV-sensitive photodiodes. Because the sensitivity of the photodiodes and other similar light-detecting devices depends on temperature, each light sensor could also include a temperature sensor, such as a thermocouple, to measure the temperature of the light-sensitive device, e.g. the photodiode. The output of the light sensors, including temperature-dependent variations, could then be calibrated against a suitable reference device.

The apparatus preferably includes multiple UV light sensors at various locations on the target plane(s) 306 and 310, so that exposure uniformity may be confirmed during testing. Readings from the UV sensors are also used to continuously determine the elapsed UV exposure dose of the samples so that a computer control system can determine when testing has reached a desired dose level.

Exemplary Implementation

FIG. 9 shows an exemplary implementation of the UV exposure system. Some of its main elements include the chamber 305, lamp array 304, the electrical cabinet 314, the safety screen 407, opaque light shields of various sizes, shapes, and positions 480, an air outlet 460 that is part of the air recirculation system 460, 461, 462, and 468, cooling fans 512, flat side reflectors 300 and 312, and arrangements of flat reflectors approximating curved reflectors at the top 412 and bottom 424 of the UV exposure system.

In FIG. 9 the lamp array 304 results in significant heating of the chamber interior. The fans 512 draw air into the system for cooling, and may be automatically controlled via temperature sensors in the chamber, and control electronics in the electrical cabinet 314 to maintain the temperature of the PV module(s) 308, or some other measured temperature inside the chamber 305, at a predetermined point.

The exemplary implementation of the UV exposure system in FIG. 9, as shown, includes a linear array of vertically aligned fluorescent tube lamps which make up the lamp array 304. The lamps near the side reflectors 300 and 312 have been moved closer to the target planes 306 and 310 to take into account reflective losses at the side reflectors 300 and 312 and increase the irradiance intensity uniformity at the target plane(s) 306 and 310.

Although particularly described with reference to a specific number and/or type of light, other numbers and types of lights could be employed and remain within this disclosure. Furthermore, although particular reflective materials are described herein it should be appreciated that other materials could also be employed and remain within this disclosure. Additionally, although certain geometries and orientations of the lamp array and reflectors where particularly described, others could be used and remain within the scope of the disclosed subject matter.

In addition to the above described embodiments, those skilled in the art will appreciate that this disclosure has application in a variety of arts and situations and this disclosure is intended to include the same.

What is claimed is:

1. An apparatus for exposing photovoltaic (PV) modules to ultraviolet light, comprising:
   a vertically oriented lamp array, said lamp array comprised of a plurality of ultraviolet (UV) light sources;
   at least one vertically oriented target plane; and
   at least one reflector, said at least one reflector oriented to direct UV light from said lamp array to said at least one target plane, wherein the distance from at least one of said at least one reflectors to the light emitting portion of the nearest UV light source or group of UV light sources is at most one half the spacing between said UV light sources.

2. An apparatus for exposing photovoltaic (PV) modules to ultraviolet light, comprising:
   a vertically oriented lamp array, said lamp array comprised of a plurality of ultraviolet (UV) light sources;
   at least one vertically oriented target plane; and
   at least one reflector, said at least one reflector oriented to direct UV light from said lamp array to said at least one target plane, wherein the position of said UV light sources near the edge of said lamp array is closer to said at least one target plane than the position of said UV light sources near the center of said lamp array to provide enhanced exposure uniformity on said at least one target plane.

3. An apparatus for exposing photovoltaic (PV) modules to ultraviolet light, comprising:
- a vertically oriented lamp array, said lamp array comprised of a plurality of ultraviolet (UV) light sources;
- at least one vertically oriented target plane;
- at least one reflector, said at least one reflector oriented to direct UV light from said lamp array to said at least one target plane; and
- one or more opaque light shields, said one or more opaque light shields disposed between said lamp array and said at least one target plane such that the intensity of said UV light is more uniform across said at least one target plane, wherein any one or more of the size, shape, and position of said one or more opaque light shields is automatically adjusted.

* * * * *